US009595533B2

(12) United States Patent
Tanzawa et al.

(10) Patent No.: US 9,595,533 B2
(45) Date of Patent: Mar. 14, 2017

(54) MEMORY ARRAY HAVING CONNECTIONS GOING THROUGH CONTROL GATES

(75) Inventors: Toru Tanzawa, Tokyo (JP); Tamotsu Murakoshi, Kanagawa (JP); Deepak Thimmegowda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 13/599,793

(22) Filed: Aug. 30, 2012

(65) Prior Publication Data
US 2014/0061747 A1    Mar. 6, 2014

(51) Int. Cl.
*H01L 29/76*    (2006.01)
*H01L 27/115*   (2006.01)
*H01L 29/66*    (2006.01)
*H01L 29/792*   (2006.01)
*G11C 16/04*    (2006.01)

(52) U.S. Cl.
CPC .... *H01L 27/11582* (2013.01); *G11C 16/0483* (2013.01); *H01L 27/11529* (2013.01); *H01L 27/11548* (2013.01); *H01L 27/11556* (2013.01); *H01L 27/11573* (2013.01); *H01L 27/11575* (2013.01); *H01L 29/66833* (2013.01); *H01L 29/7926* (2013.01)

(58) Field of Classification Search
CPC ......... H01L 27/11582; H01L 27/11556; H01L 27/11578; H01L 27/11551; H01L 27/11524
USPC .................. 257/368, 395, E21.645, E27.081
See application file for complete search history.

(56) References Cited

U.S. PATENT DOCUMENTS

| 5,828,621 A | 10/1998 | Tanzawa et al. |
| 6,777,777 B1 * | 8/2004 | Kar-Roy ............. H01L 23/5223 257/310 |
| 2010/0090286 A1 * | 4/2010 | Lee ................... H01L 27/11526 257/368 |
| 2011/0057249 A1 | 3/2011 | Nakao et al. |
| 2011/0058418 A1 | 3/2011 | Choi et al. |
| 2011/0084397 A1 | 4/2011 | Lung |

(Continued)

FOREIGN PATENT DOCUMENTS

| CN | 104662660 A | 5/2015 |
| JP | 2009266280 A | 11/2009 |

(Continued)

OTHER PUBLICATIONS

Cernea, Raul, et al., "A 34MB/s-Program-Throughput 16Gb MLC NAND with All-Bitline Architecture in 56nm", Digest of Technical Papers. IEEE International Solid-State Circuits Conference, 2008. ISSCC 2008., (Feb. 2008), 420-421, 624.

(Continued)

*Primary Examiner* — Jesse Y Miyoshi
(74) *Attorney, Agent, or Firm* — Schwegman Lundberg & Woessner, P.A.

(57) ABSTRACT

Some embodiments include apparatuses and methods having a substrate, a memory cell string including a body, a select gate located in a level of the apparatus and along a portion of the body, and control gates located in other levels of the apparatus and along other respective portions of the body. At least one of such apparatuses includes a conductive connection coupling the select gate or one of the control gates to a component (e.g., transistor) in the substrate. The connection can include a portion going through a portion of at least one of the control gates.

11 Claims, 37 Drawing Sheets

(56) References Cited

U.S. PATENT DOCUMENTS

| 2011/0115010 A1 | 5/2011 | Shim et al. |
| 2011/0244666 A1 | 10/2011 | Kim et al. |
| 2012/0061744 A1 | 3/2012 | Hwang et al. |
| 2012/0306090 A1 | 12/2012 | Smith |

FOREIGN PATENT DOCUMENTS

| JP | 2009266946 A | 11/2009 |
| KR | 1020090112553 A | 10/2009 |
| KR | 1020110049876 A | 5/2011 |
| TW | 201431048 A | 8/2014 |
| WO | WO-2014036294 A1 | 3/2014 |

OTHER PUBLICATIONS

Chiang, M H, et al., "Novel High-Density Low-Power Logic Circuit Techniques Using DG Devices", IEEE ED, 52(10), (2005), 2339-42.

Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a three-dimensional array of diode/antifuse memory cells", IEEE Journal of Solid-State Circuits, 38(11), (2003), 1920-1928.

Katsumata, R., et al., "Pipe-shaped BiCS flash memory with 16 stacked layers and multi-level-cell operation for ultra high density storage devices", Symposium on VLSI Technology, (Jun. 2009), 136-37.

Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.

Kim, W., et al., "Multi-layered Vertical Gate NAND Flash overcoming stacking limit for terabit density storage", Symposium on VLSI Technology, (2009), 188-89.

Sakui, K, et al., "Design Impacts on NAND Flash Memory Core Circuits with Vertical MOSFETs", IEEE International Memory Workshop (IMW), (May 2010), 1-4.

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.

Tanzawa, T., et al., "Circuit techniques for a 1.8-V-only NAND flash memory", IEEE Journal of Solid-State Circuits, 37(1), (Jan. 2002), 84-89.

"International Application Serial No. PCT/US2013/057345, International Search Report mailed Dec. 24, 2013", 3 pgs.

"International Application Serial No. PCT/US2013/057345, Written Opinion mailed Dec. 24, 2013", 7 pgs.

"Taiwanese Application Serial No. 102130475, Response filed Apr. 16, 2014 to Office Action mailed Mar. 18, 2014", 42 pgs.

"European Application Serial No. 13834123.5, Extended European Search Report mailed Mar. 11, 2016", 6 pgs.

"International Application Serial No. PCT/US2013/057345, International Preliminary Report on Patentability mailed Mar. 12, 2015", 9 pgs.

\* cited by examiner

MEMORY ARRAY HAVING CONNECTIONS GOING THROUGH CONTROL GATES

BACKGROUND

Memory devices, such as flash memory, are widely used in computers and many electronic items. Such memory devices have numerous memory cells and internal interconnections coupled between the memory cells and other circuitry in the device. As memory cell density increases for a given device area, routing such interconnections in the device may become difficult.

DETAILED DESCRIPTION

Figure 1A:
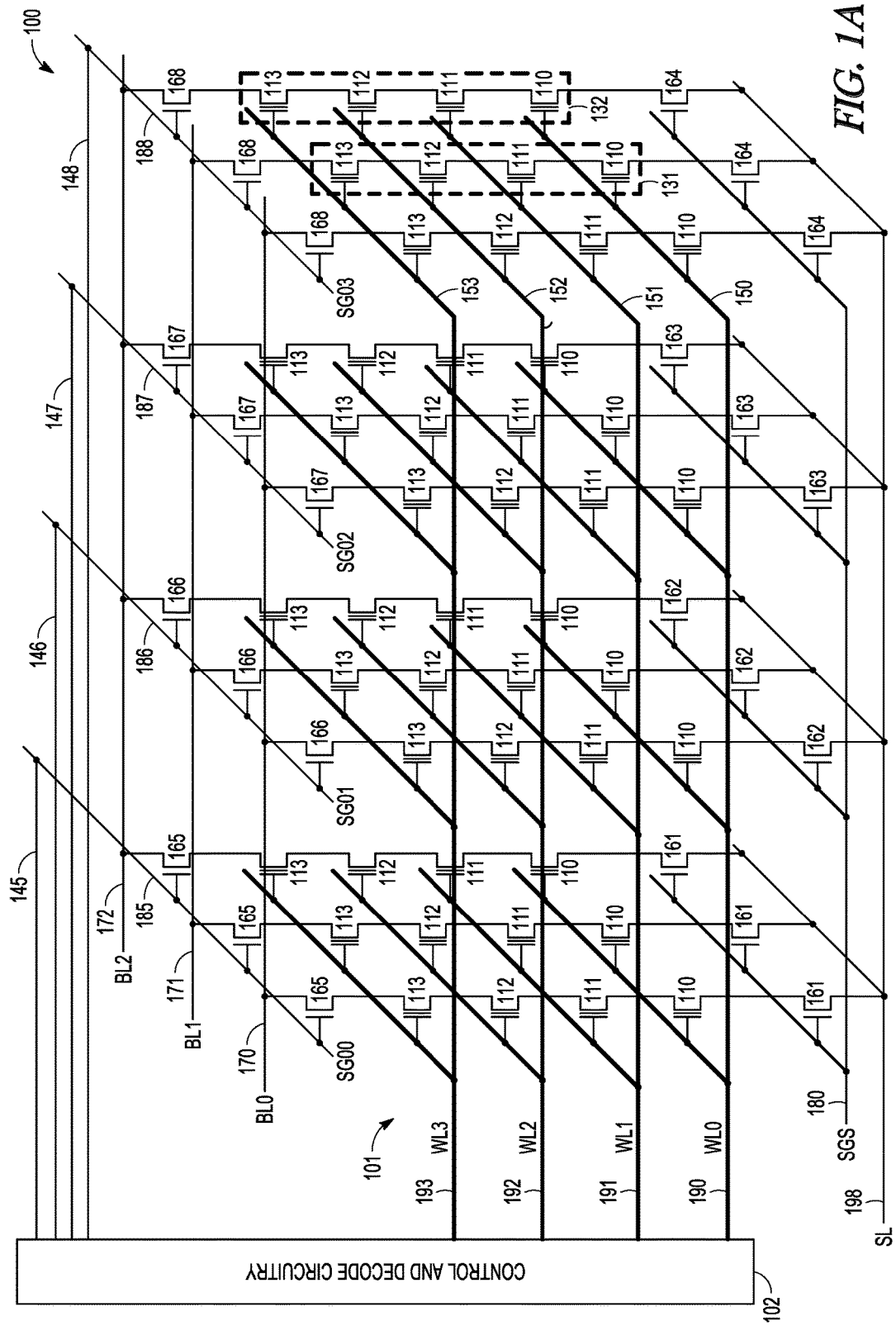
FIG. 1A shows a schematic diagram of an apparatus in the form a memory device having a memory array, control and decode circuitry, and connections, according to an embodiment of the invention.

FIG. 1A shows a portion of a schematic diagram of an apparatus in the form a memory device 100 having a memory array 101, control and decode circuitry 102, connections 145, 146, 147, and 148, and connections 190, 191, 192, and 193, according to an embodiment of the invention.

Memory device 100 can include memory cells 110, 111, 112, and 113 arranged in memory cell strings, such as memory cell strings 131 and 132. For simplicity, in FIG. 1A, only two of the memory cell strings are labeled (131 and 132). FIG. 1A shows an example of 12 memory cell strings and four memory cells 110, 111, 112, and 113 in each memory cell string. The number of such memory cell strings and number of such memory cells in each memory cell string can vary.

Control and decode circuitry 102 can operate to access memory cells 110, 111, 112, and 113 during a memory operation to store information in memory cells 110, 111, 112, and 113 (e.g., a write operation) or to obtain information from memory cells 110, 111, 112, and 113 (e.g., a read operation). For simplicity, FIG. 1A shows control and decode circuitry 102 as a single block. Control and decode circuitry 102, however, can include different elements (e.g., circuits) that can be located in different locations in memory device 100. For example, control and decode circuitry 102 can include a decoder (e.g., column decoder) coupled to connections 145, 146, 147, and 148, and another decoder (e.g., row decoder) coupled to connections 190, 191, 192, and 193.

Memory device 100 can include control gates 150, 151, 152, and 153 that can carry corresponding signals WL0, WL1, WL2, and WL3. Control gates 150, 151, 152, and 153 and connections 190, 191, 192, and 193 can form parts of access lines of memory device 100, such that each of such access lines can include one of control gates 150, 151, 152, and 153 and/or one of connections 190, 191, 192, and 193. For example, an access line of memory device 100 can include control gate 150 and/or connection 190, and another access line of memory device 100 can include control gate 151 and/or connection 191. Memory device 100 can use signals WL0, WL1, WL2, and WL3, respectively, to control access to memory cells 110, 111, 112, and 113 respectively, such as to obtain (e.g., sense) information (e.g., in a read operation) from memory cells 110, 111, and 112, or to store information (e.g., in a write operation) in memory cells 110, 111, 112, and 113. FIG. 1A shows four control gates 150, 151, 152, and 153 as an example. The number of such control gates can vary. As shown in FIG. 1A, memory cells in different memory cell strings can share the same control gate (e.g., share the same physical control gate). For example, memory cells 110 can share control gate 150. Memory cells 111 can share control gate 151. Memory cells 112 can share control gate 152. Memory cells 113 can share control gate 153. Each of control gates 150, 151, 152, and 153 can be structured as a single control gate located in a single device level of memory device 100.

Connections 190, 191, 192, and 193 of memory device 100 can couple respective control gates 150, 151, 152, and 153 to other circuitry of memory device 100, such as control and decode circuit 102. Connections 190, 191, 192, and 193 can be structured as conductive connections in memory device 100. Memory device 100 may provide signals (e.g., WL0, WL1, WL2, and WL3) from control and decode circuitry 102 to control gates 150, 151, 152, and 153 through connections 190, 191, 192, and 193, respectively.

Memory device 100 can include data lines 170, 171, and 172 that carry signals BL0, BL1, and BL2, respectively, and line 198 that can carry a signal SL (e.g., source line signal). FIG. 1A shows three data lines 170, 171, and 172 as an example. The number of such data lines can vary. Each of data lines 170, 171, and 172 can be structured as a conductive line in memory device 100. Line 198 can be structured as a conductive line and can form part of a source (e.g., a source line) of memory device 100. In a read operation, memory device 100 can use data lines 170, 171, and 172 to provide the information obtained from memory cells 110, 111, 112, and 113. In a write operation, memory device 100 can use data lines 170, 171, and 172 to provide the information to be stored in memory cells 110, 111, 112, and 113.

Memory device 100 can include select gates (e.g., drain select gates) 185, 186, 187, and 188 and transistors (e.g., drain select transistors) 165, 166, 167, and 168. Transistors 165 can share the same select gate 185. Transistors 166 can share the same select gate 186. Transistors 167 can share the same select gate 187. Transistors 168 can share the same select gate 188.

Connections 145, 146, 147, and 148 can couple respective select gates 185, 186, 187, and 188 to other circuitry of memory device 100, such as control and decode circuit 102. Connections 145, 146, 147, and 148 can be structured as conductive connections in memory device 100. Memory device 100 may provide signals (e.g., SGD0, SGD1, SGD2, and SGD3) from control and decode circuitry 102 to select gates 185, 186, 187, and 188 through connections 145, 146, 147, and 148, respectively.

Transistors 165, 166, 167, and 168 can be controlled (e.g., turned on or turned off) by signals SGD0, SGD1, SGD2, and SGD3, respectively. During a memory operation, such as a read or write operation, transistors 165, 166, 167, and 168 can be turned on (e.g., by activating respective signals SGD0, SGD1, SGD2, and SGD3) to couple the memory cell strings of memory device 100 to data lines 170, 171, and 172. Transistors 165, 166, 167, and 168 can be turned off (e.g., by deactivating respective signals SGD0, SGD1, SGD2, and SGD3) to decouple the memory cell strings of memory device 100 from data lines 170, 171, and 172.

Memory device 100 can include transistors (e.g., source select transistors) 161, 162, 163, and 164, each of which can be coupled between line 198 and an associated memory cell string (e.g., memory cell string 131 or 132). Transistors 161, 162, 163, and 164 can share the same select gate (e.g., source select gate) 180 of memory device 100.

Transistors 161, 162, 163, and 164 can be controlled (e.g., turned on or turned off) by the same signal, such as an SGS signal (e.g., source select gate signal) provided on select gate 180. During a memory operation, such as a read or write operation, transistors 161, 162, 163, and 164 and can be turned on (e.g., by activating an SGS signal) to couple the memory cell strings of memory device 100 to line 198. Transistors 161, 162, 163, and 164 can be turned off (e.g., by deactivating the SGS signal) to decouple the memory cell strings of memory device 100 from line 198.

Figure 1B:
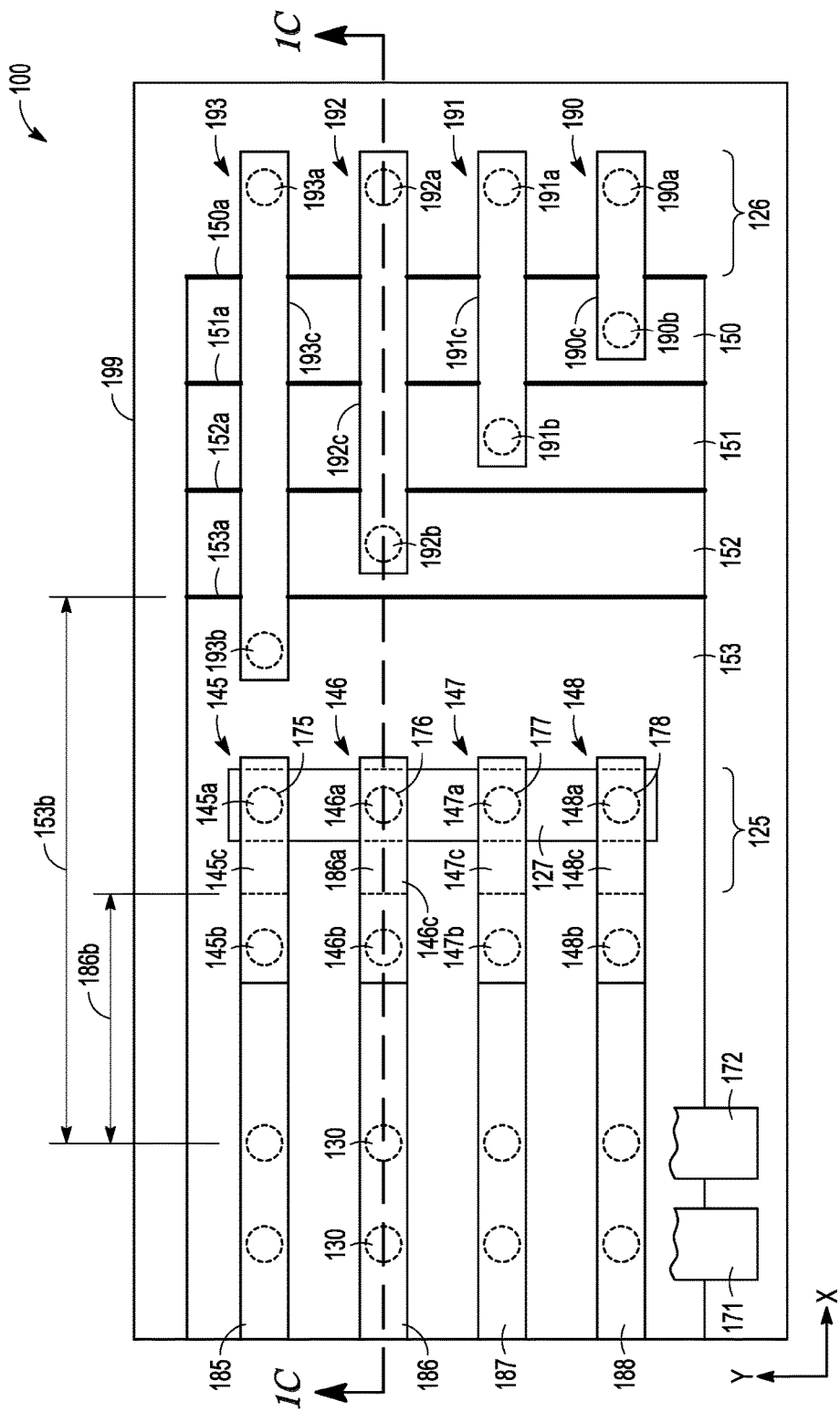
FIG. 1B through FIG. 1F show different views of a structure of a portion of the memory device of FIG. 1A, according to an embodiment of the invention.
Figure 1C:
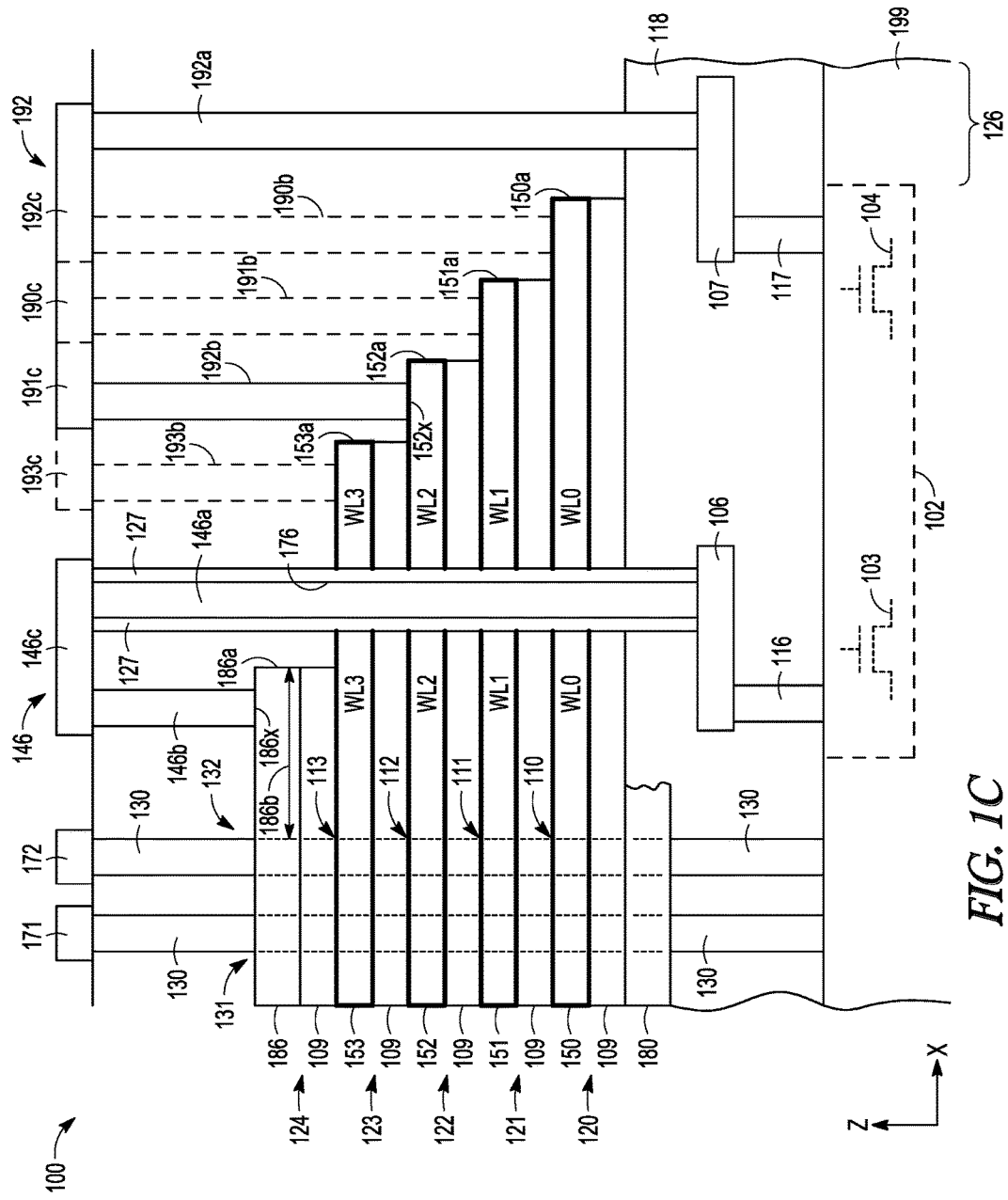
Figure 1D:
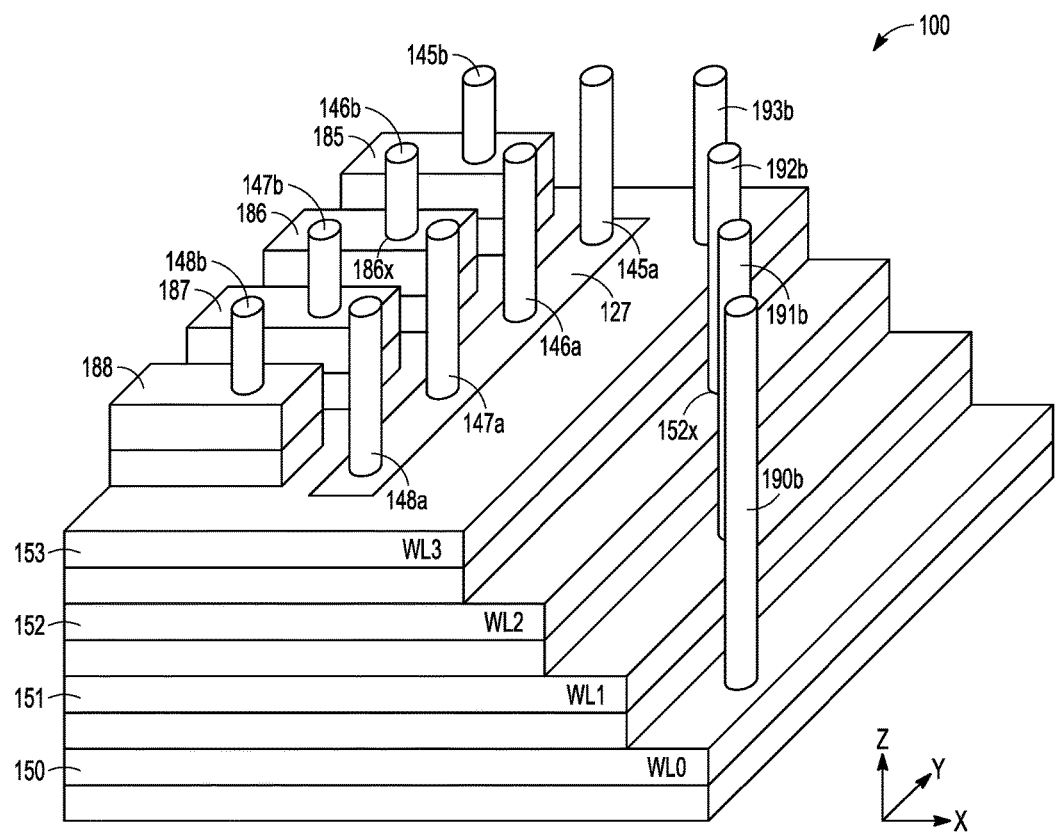
Figure 1E:
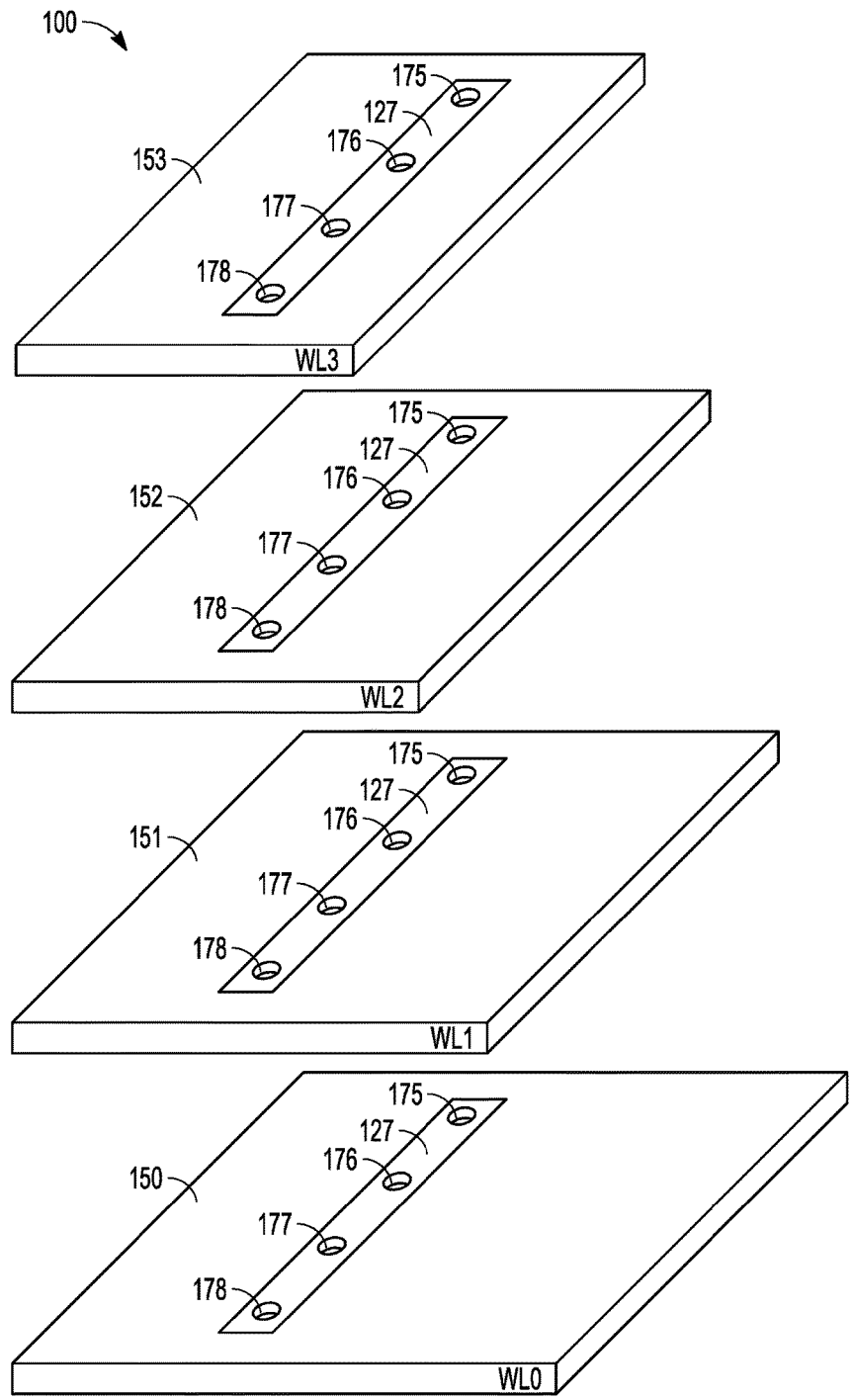
Figure 1F:
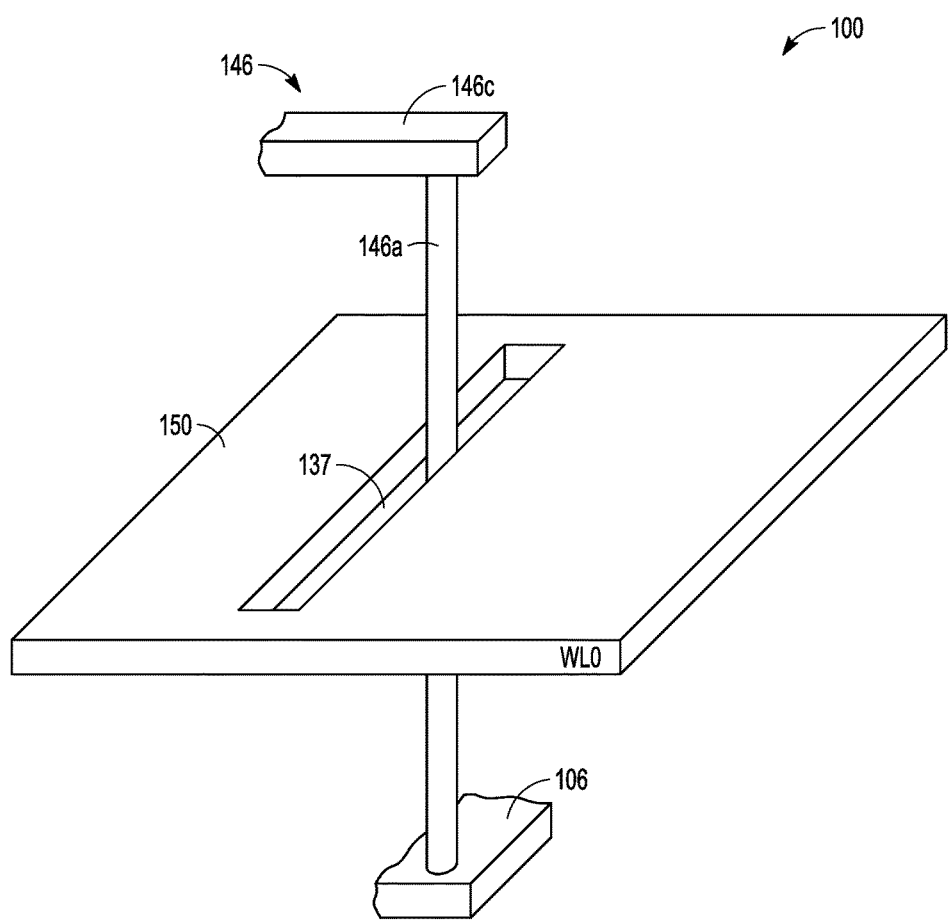

FIG. 1B shows a top view of a structure of a portion of memory device 100 of FIG. 1A, according to an embodiment of the invention. FIG. 1C shows a side view of the structure of the portion of memory device 100 along line 1C of FIG. 1B. FIG. 1D shows a perspective view of a portion of memory device 100 of FIG. 1B and FIG. 1C. FIG. 1E shows an exploded view of structures of portions of control gates 150, 151, 152, and 153, openings (e.g., holes) 175, 176, 177, and 178, and a dielectric material 127 of memory device 100 of FIG. 1B through FIG. 1D. FIG. 1F shows another view of structures of one of control gates 150, 151, 152, and 153 (e.g., control gate 150) having an opening 137 and segments 146a and 146c of connection 146 coupled to a conductive contact 106. Opening 137 can be filled with dielectric material 127 (FIG. 1B through FIG. 1E). The following description refers to FIG. 1B through FIG. 1E.

As shown in FIG. 1B and FIG. 1C, memory device 100 can include a substrate 199, which can include a semiconductor substrate (e.g., a silicon substrate). Each of memory cell strings 131 and 132 (also shown in FIG. 1A) can include a body 130 extending outwardly from (e.g., perpendicular to) substrate 199. For example, body 130 can include a pillar of a combination of materials where a length of the pillar extends in a z-direction, which is perpendicular to an x-direction and y-direction. As shown in FIG. 1C, memory device 100 can include different device levels 120, 121, 122, 123, and 124 with respect to the z-direction. Memory cells 110, 111, 112, and 113 of memory cell strings 131 and 132 can be located in device levels 120, 121, 122, and 123, respectively, over substrate 199.

Body 130 can include different materials that can be formed in distinct layers in the x-direction. For example, body 130 can include a charge blocking material(s) (e.g., a dielectric material such as silicon nitride) that is capable of blocking a tunnel of a charge. The charge blocking material can directly contact the materials of control gates 150, 151, 152, and 153.

Body 130 can also include a charge storage material(s) arranged such that the charge blocking material (mentioned above) can be between the charge storage material(s) and materials of control gates 150, 151, 152, and 153. The charge storage material(s) can provide a charge storage function to represent a value of information stored in memory cell 110, 111, 112, and 113. For example, the charge storage material(s) can include a charge trapping material (e.g., SiN) that can be configured to trap charges. In another example, the charge storage material(s) can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., a memory cell 110, 111, 112, or 113).

Body 130 can further include a tunnel dielectric material(s) (e.g., an oxide of silicon) arranged such that the charge storage material (mentioned above) can be between the tunnel dielectric material(s) and the charge blocking material(s). The tunnel dielectric material(s) can allow tunneling of a charge (e.g., electrons) from an additional material of body 130 to the charge storage material(s).

The additional material of body 130 can include a semiconductor material that can be surrounded (or partially surrounded) by the tunnel dielectric material(s). The semiconductor material of body 130 can include n-type material (e.g., n-type polycrystalline silicon) or p-type material (e.g., p-type polycrystalline silicon).

As shown in FIG. 1B and FIG. 1C, select gates 185, 186, 187, and 188 can include conductive materials (e.g., conductively doped polycrystalline silicon or other conductive material) over substrate 199. The conductive material of each of select gates 185, 186, 187, and 188 can include portions opposing (e.g., surrounding or partially surrounding) respective portions of bodies 130 of memory cell strings associated with the same select gate. For example, the conductive material of select gate 186 can surround (or partially surround) respective portions of the bodies 130 of memory cell strings 131 and 132 associated with select gate 186. Each of select gates 185, 186, 187, and 188 can include an edge, such as edge 186a of select gate 186. As shown in FIG. 1B, a distance between body 130 of memory cell string 132 and edge 186a of select gate 186 is indicated as distance 186b. For simplicity, FIG. 1B and FIG. 1C omits labels for the edges of select gates 185, 187, and 188.

Control gates 150, 151, 152, and 153 can include conductive materials (e.g., conductively doped polycrystalline silicon or other conductive material) over substrate 199. As shown in FIG. 1B and FIG. 1C, the conductive material of each of control gates 150, 151, 152, and 153 can include a portion opposing (e.g., surrounding or partially surrounding) a respective portion of the same body 130 of a memory cell string. For example, the conductive material of control gate 150 can surround (or partially surround) a portion of body 130 of memory cell string 132 near the location of memory cell 110. The conductive material of control gate 151 can surround (or partially surround) a portion of body 130 of memory cell string 132 near the location of memory cell 111. The conductive material of control gate 152 can surround (or partially surround) a portion of body 130 of memory cell string 132 near the location of memory cell 112. The conductive material of control gate 153 can surround (or partially surround) a portion of body 130 of memory cell string 132 near the location of memory cell 113.

As shown in FIG. 1C, memory device 100 can include a dielectric material (e.g., an oxide of silicon or other dielectric material) 109 in between two adjacent control gates 150, 151, 152, and 153 and between select gates 185, 186, 187, and 188 and control gate 153. Memory device 100 can also include a dielectric material (e.g., an oxide of silicon) 118 in between substrate 199 and control gates 150, 151, 152, and 153.

Control gates 150, 151, 152, and 153 can include edges 150a, 151a, 152a, and 153a, respectively, along the y-direction. As shown in FIG. 1C and FIG. 1D, edges 150a, 151a, 152a, and 153a can form a staircase. A distance between a reference location in memory device 100 and edges 150a, 151a, 152a, and 153a are unequal. For example, as shown in FIG. 1C, a distance (in the x-direction) between body 130 of memory cell string 132 and edge 150a can be greater than a distance (in the x-direction) between body 130 of memory cell string 132 and edge 151a. In another example, a distance between body 130 of memory cell string 132 and edge 151a can be greater than a distance between body 130 of memory cell string 132 and edge 152a.

A distance between a reference location in memory device 100 and each of edges 150a, 151a, 152a, and 153a can be different from a distance between such a reference location and an edge of each of select gates 185, 186, 187, and 188. For example, as shown in FIG. 1C, a distance (in the x-direction) between body 130 of memory cell string 132 and edge 153a can be greater than a distance (in the x-direction) between body 130 of memory cell string 132 and edge 186a of select gate 186.

As shown in FIG. 1C, control and decode circuitry 102 can include transistors (e.g., field effect transistors), such as transistors 103 and 104. FIG. 1C shows only two transistors 103 and 104 as an example. Control and decode circuitry 102 can include numerous transistors configured to perform one or more functions, such as decoding functions to selectively provide signals and access to memory cells 110, 111, 112, and 113. At least a portion (e.g., source and drain regions) of each of transistors (e.g., transistors 103 and 104) of control and decode circuitry 102 can be formed in an area of substrate 119.

Connections 145, 146, 147, and 148 can include conductive materials to couple respective select gates 185, 186, 187, and 188 to control and decode circuitry 102 in substrate 199. Each of connections 145, 146, 147, and 148 can include different segments (conductive segments) and can be coupled to a contact area of a respective select gate among select gates 185, 186, 187, and 188. For example, as shown in FIG. 1C, connection 146 can be coupled to contact area 186x of select gate 186. Connection 146 can include segments 146a, 146b, and 146c. Segments 146a and 146b can be perpendicular to substrate 199. Segment 146c can be parallel to substrate 199 and can couple segment 146a to segment 146b. The other connections 145, 147, and 148 can be coupled to contact areas of respective select gates 185, 187, and 188. Connections 145, 147, and 148 can include respective segments 145a, 147a, and 148a, and segments 145b, 147b, and 148b, as shown in FIG. 1B.

As shown in FIG. 1B, FIG. 1C, and FIG. 1E, memory device 100 can include dielectric material 127 and openings 175, 176, 177, and 178 located in an area 125 (FIG. 1B) of memory device 100. Dielectric material 127 can include an oxide of silicon. Area 125 (where openings 175, 176, 177, and 178 can be located) can be between a location of the edges of the select gates 185, 186, 187, and 188 and a location of edges 150a, 151a, 152a, and 153a of respective control gates 150, 151, 152, and 153.

Openings 175, 176, 177, and 178 (as shown in FIG. 1C) can be filled with conductive materials (e.g., conductively doped polysilicon, metal, or other conductive material). Openings 175, 176, 177, and 178 can be formed in dielectric material 127, such that they can be separated from (e.g., not directly contacting) control gates 150, 151, 152, and 153 by a portion of dielectric material 127.

Each of openings 175, 176, 177, and 178 can extend through the stack of control gates 150, 151, 152, and 153. Thus, at least a portion of the material of each of connections 145, 146, 147, and 148 can be inside a respective opening among openings 175, 176, 177, and 178 going through the material of control gates 150, 151, 152, and 153. For example, as shown in FIG. 1C, a portion of the material of segment 146a of connection 146 can be inside of opening 176 that goes through the material of each of control gates 150, 151, 152, and 153.

As shown in FIG. 1C, segment 146a of connection 146 can be coupled to a conductive contact 106 over substrate 199 and to transistor 103 through a conductive path 116. Similarly, connections 145, 147, and 148 can include segments coupled to respective conductive contacts (not shown in FIG. 1C but they can be similar to conductive contact 106). Thus, connections 145, 146, 147, and 148 can be coupled to a respective conductive contact (e.g., 106) over substrate 199 and to at least one transistor (e.g., 103) in substrate 199 through a conductive path (e.g., 116).

As shown in FIG. 1C, connections 190, 191, 192, and 193 can include conductive materials to couple respective control gates 150, 151, 152, and 153 to control and decode circuitry 102 in substrate 199. The conductive materials of connections 190, 191, 191, and 192 can be similar to or identical to those of connections 145, 146, 147, and 148. Each of connections 190, 191, 192, and 193 can include different segments (conductive segments) and can be coupled to a contact area of a respective control gate among select gates 150, 151, 152, and 153. For example, as shown in FIG. 1C, connection 192 can be coupled to contact area 152x of control gate 152. Connection 192 can include segments 192a, 192b, and 192c. Segments 192a and 192b can be perpendicular to substrate 199. Segment 192c can be parallel to substrate 199 and can couple segment 192a to segment 192b. The other connections 190, 191, and 193 can be coupled to contact areas of respective control gates 190, 191, and 193. Connections 190, 191, and 193 can also include conductive segments with similar arrangements. For example, connection 190 can include segments 190a, 190b, and 190c. Connection 191 can include segments 191a, 191b, and 191c. Connection 193 can include segments 193a, 193b, and 193c. As shown in FIGS. 1B and 1C, segments 190a, 191a, 192a, and 193a of connections 190, 191, 192, and 193, respectively, can be located in an area 126 of memory device 100. Area 126 can include an area outside a staircase formed by edges 150a, 151a, 152a, and 153a of respective control gates 150, 151, 152, and 153.

As shown in FIG. 1C, segment 192a of connection 192 can be coupled to a conductive contact 107 over substrate 199 and to transistor 104 through a conductive path 117. Similarly, connections 190, 191, and 193 can include segments coupled to respective conductive contacts (not shown in FIG. 1C but they can be similar to conductive contact 107). Thus, each of connections 190, 191, 192, and 193 can be coupled to a respective conductive contact (e.g., 107) over substrate 199 and to at least one transistor (e.g., 104) in substrate 199 through a respective conductive path (e.g., 117).

Thus, as described above, each of connections 145, 146, 147, and 148 can include a segment (e.g., 146c in FIG. 1C) between a contact area (e.g., 186x) of a select gate (e.g., 186) and a contact area (e.g., 152x) of a control gate (e.g., 152). Such a segment (e.g., 146c) can also be inside an opening (e.g., 176) in which the opening can be located between a contact area (e.g., 186x) of a select gate (e.g., 186) and a contact area (e.g., 152x) of a control gate (e.g., 152). Such a segment (e.g., 146c) can also extend from one level to another level (e.g., among level 120 to level 124 in the z-direction) of the memory device 100.

Routing connections (e.g., connections 145, 146, 147, and 148) of a memory device described herein (as memory device 100 as described above with reference to FIG. 1A through FIG. 1F) may improve interconnections in memory device 100. For example, as memory cell density increase for a given device size of a memory device, such as memory device 100, routing interconnections (e.g., connections 145, 146, 147, and 148) through an area inside the memory array (e.g., area 125) may improve (e.g., reduce) the number, the lengths, or both, of interconnections in the memory array. Fabricating process cost associated with the memory device may also be improved (e.g., reduced) as a result of the routing described herein. Further, as shown in FIG. 1B and FIG. 1C, connections 145, 146, 147, and 148 coupled to respective select gates 185, 186, 187, and 188 (e.g., coupled to all select gates in the same memory array) and connections 190, 191, 192, and 193 coupled to respective control gates 150, 151, 152, and 153 (e.g., all control gates in the same memory array) can be routed on only one side (e.g., on the right side of FIG. 1B and FIG. 1C) to couple select gates 185, 186, 187, and 188 and control gates 150, 151, 152, and 153 to circuitry 102 in substrate 199. This routing (e.g., routing on only one side) may also improve interconnections and fabricating process cost associated with the memory device, such as memory device 100.

Figure 1G:
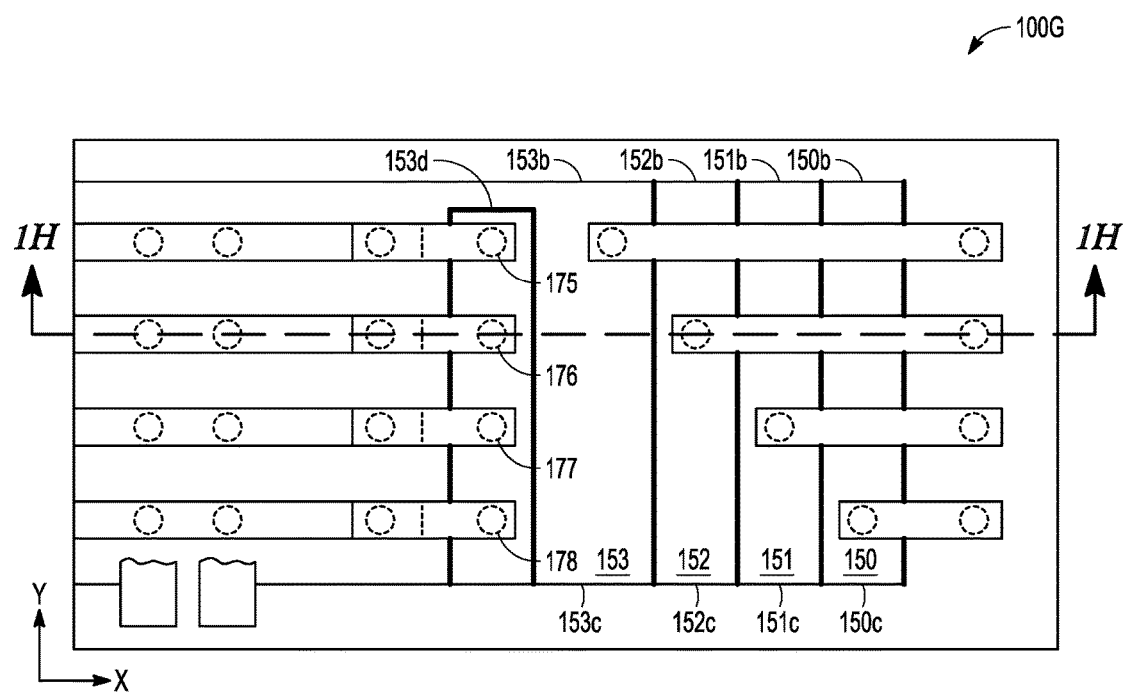
FIG. 1G and FIG. 1J show different views of a structure of a portion of another memory device, which can be a variation of the memory device of FIG. 1A through FIG. 1F, according to an embodiment of the invention.
Figure 1H:
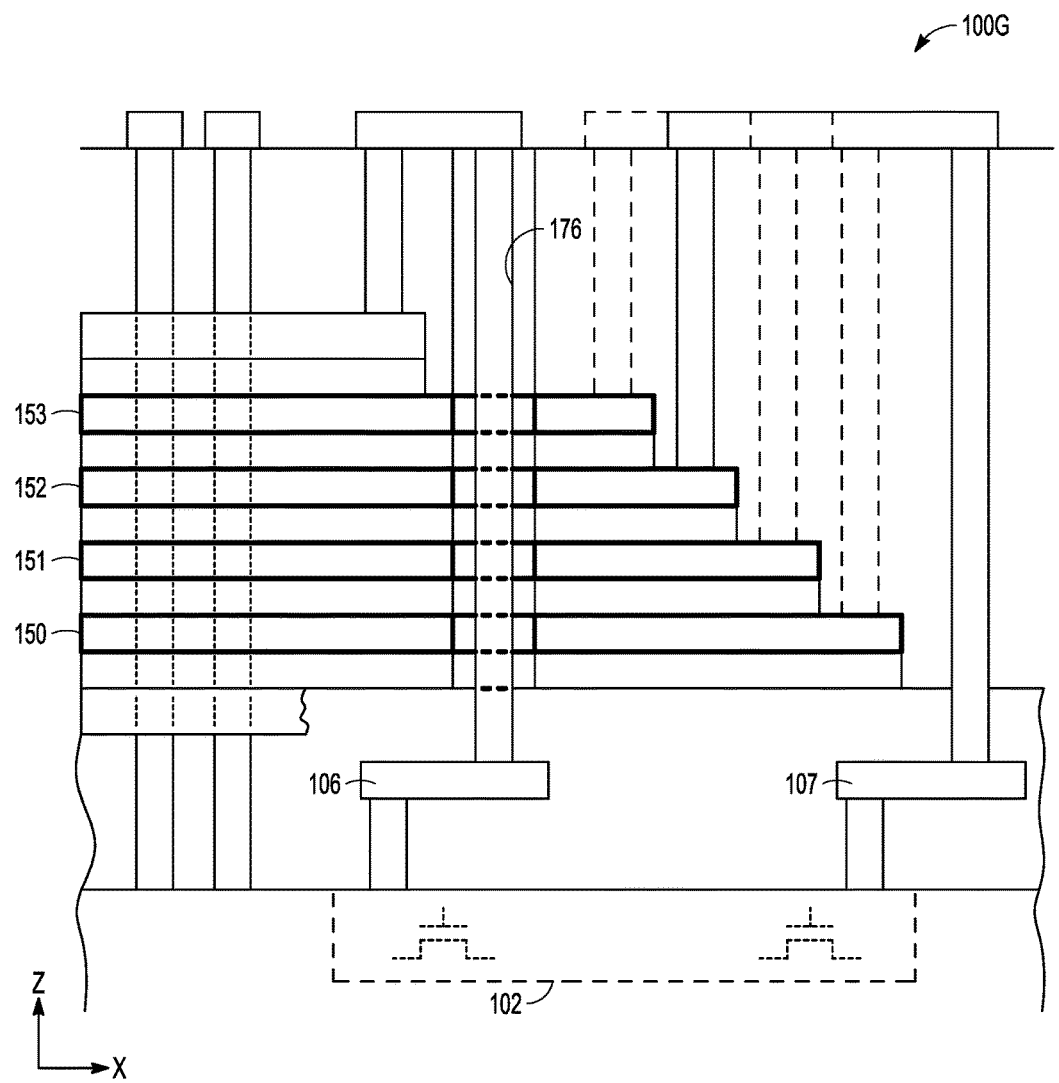
Figure 1I:
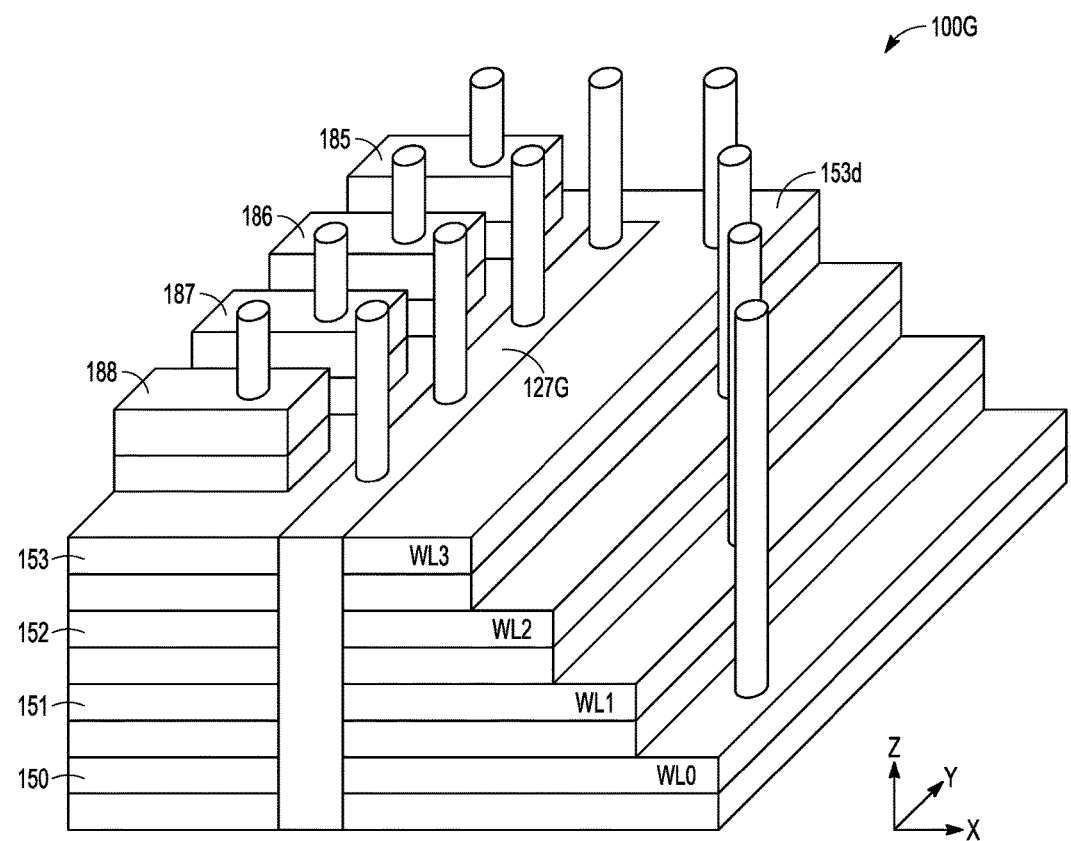
Figure 1J:
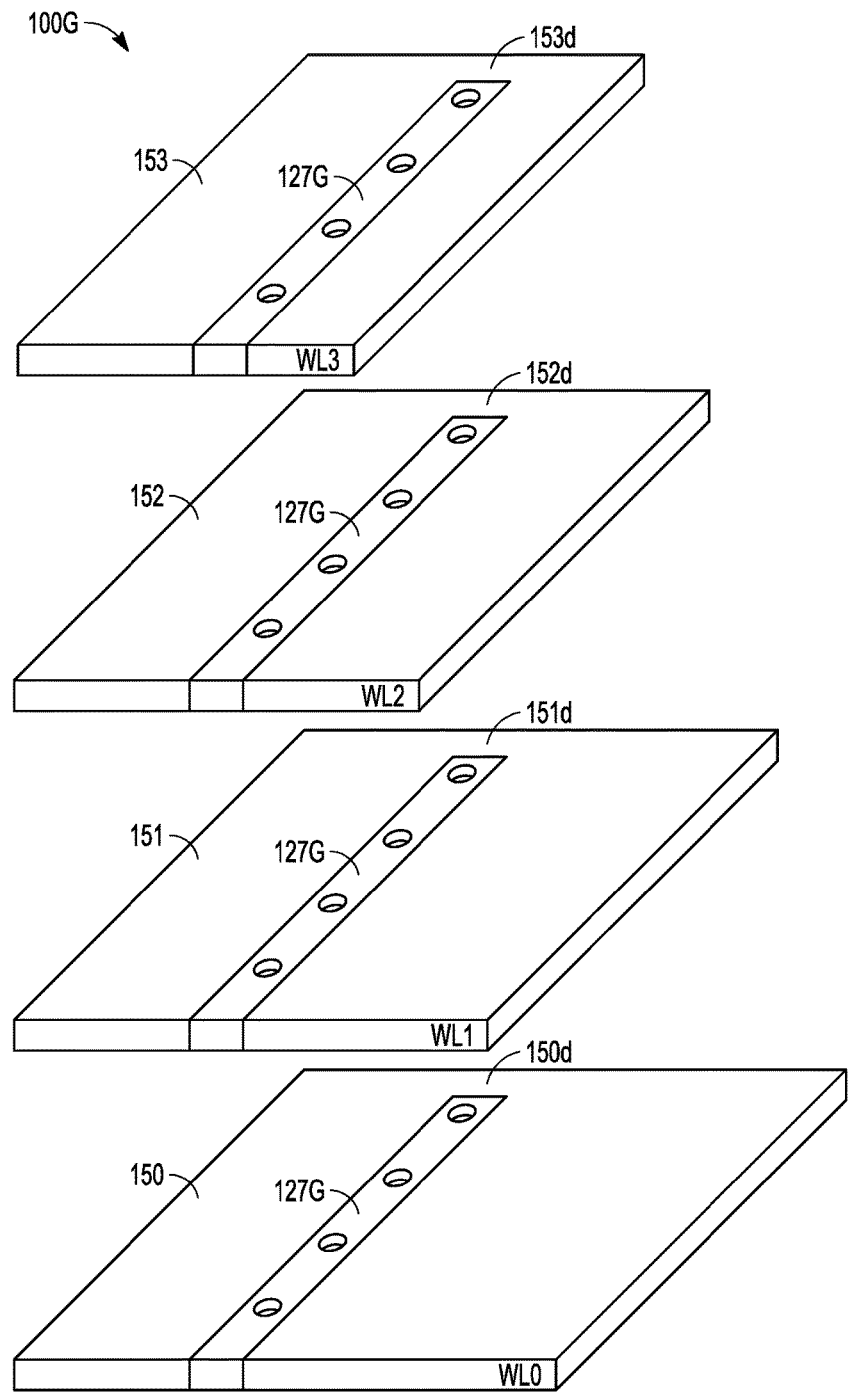
Figure 1K:
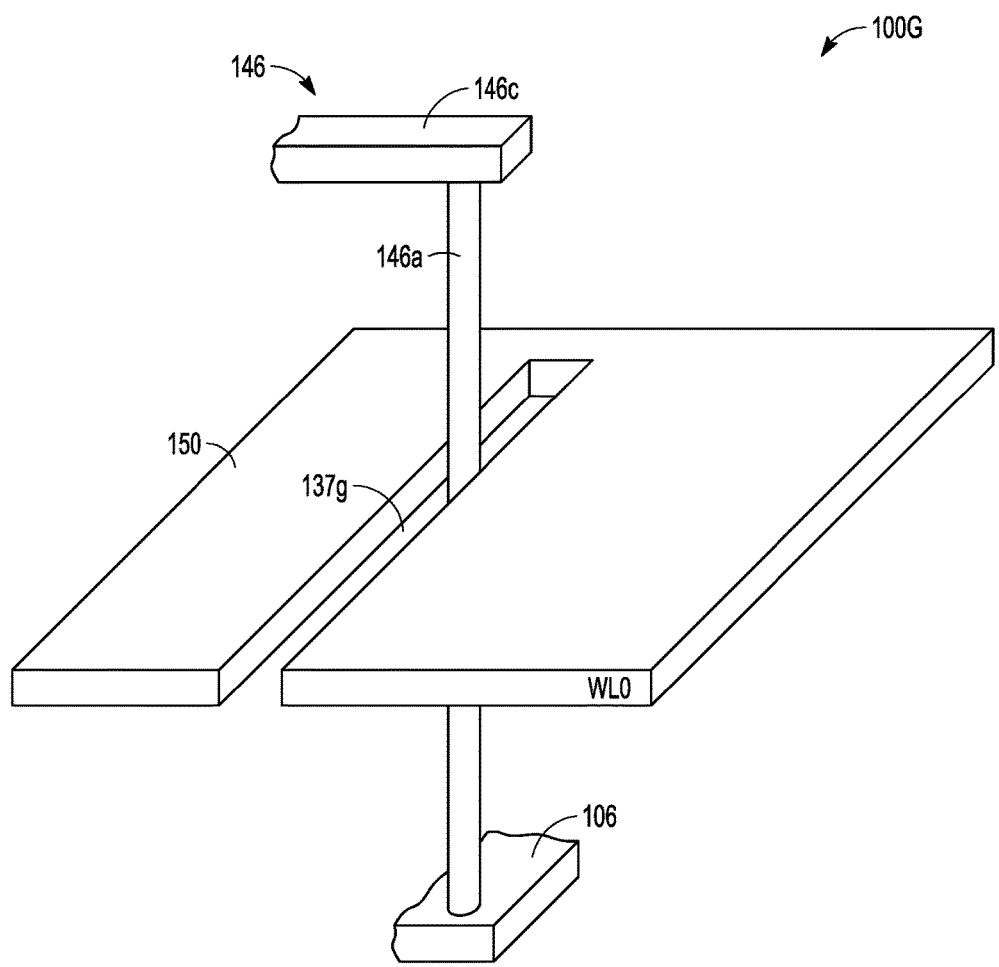

FIG. 1G shows a top view of a structure of a portion of memory device 100G, which can be a variation of memory device 100 of FIG. 1A through FIG. 1F, according to an embodiment of the invention. FIG. 1H shows a side view of the structure of the portion of memory device 100G along line 1H of FIG. 1G. FIG. 1I shows a perspective view of a portion of memory device 100G of FIG. 1G and FIG. 1H. FIG. 1J show an exploded view of structures of portions of control gates 150, 151, 152, and 153 and openings 175, 176, 177, and 178 of memory device 100 of FIG. 1G through FIG. 1I. FIG. 1K shows another view of structures of one of control gates 150, 151, 152, and 153 (e.g., control gate 150) having an opening 137G and segments 146a and 146c of connection 146 coupled to a conductive contact 106. Opening 137G can be filled with dielectric material 127 (FIG. 1G through FIG. 1J).

FIG. 1G through FIG. 1K can correspond to FIG. 1B through FIG. 1F, respectively. As shown in FIG. 1G through FIG. 1K, memory device 100G can include elements similar to or identical to those of memory device 100 (FIG. 1B through FIG. 1F). Thus, for simplicity, the description of similar or identical elements between memory devices 100 and 100G is not repeated in the description of FIG. 1G through FIG. 1K. Some of the similar or identical elements between memory devices 100 and 100G are also not labeled in FIG. 1G through FIG. 1K. The schematic diagram for memory devices 100 and 100G can be the same. However, structures of memory devices 100 and 100G can be different.

For example, differences between memory device 100 and 100G can include differences in the structures of control gates 150, 151, 152, and 153 (FIG. 1G) of memory device 100G and material 127G. As shown in FIG. 1G, FIG. 1I, and FIG. 1J, control gates 150, 151, 152, and 153 can include respective edges 150b, 151b, 152b, and 153b (on one side) along the x-direction, and edges 150c, 151c, 152c, and 153c (on another side) along the x-direction. Material 127G can extend to edges 150c, 151c, 152c, and 153c, such that control gates 150, 151, 152, and 153 are void of material at a portion of edges 150c, 151c, 152c, and 153c where material 127G is located. In comparison with FIG. 1B and FIG. 1D, material 127 of FIG. 1B does not extend to the edges that correspond to edges 150c, 151c, 152c, and 153c of FIG. 1G and FIG. 1I. Thus, each of control gates 150, 151, 152, and 153 of memory device 100G can include two portions (e.g., left and right) that is coupled together by only a narrow portion (e.g., portion 150d, 151d, 152d, and 153d in FIG. 1J) at their respective edges 150b, 151b, 152b, and 153b.

Figure 2A:
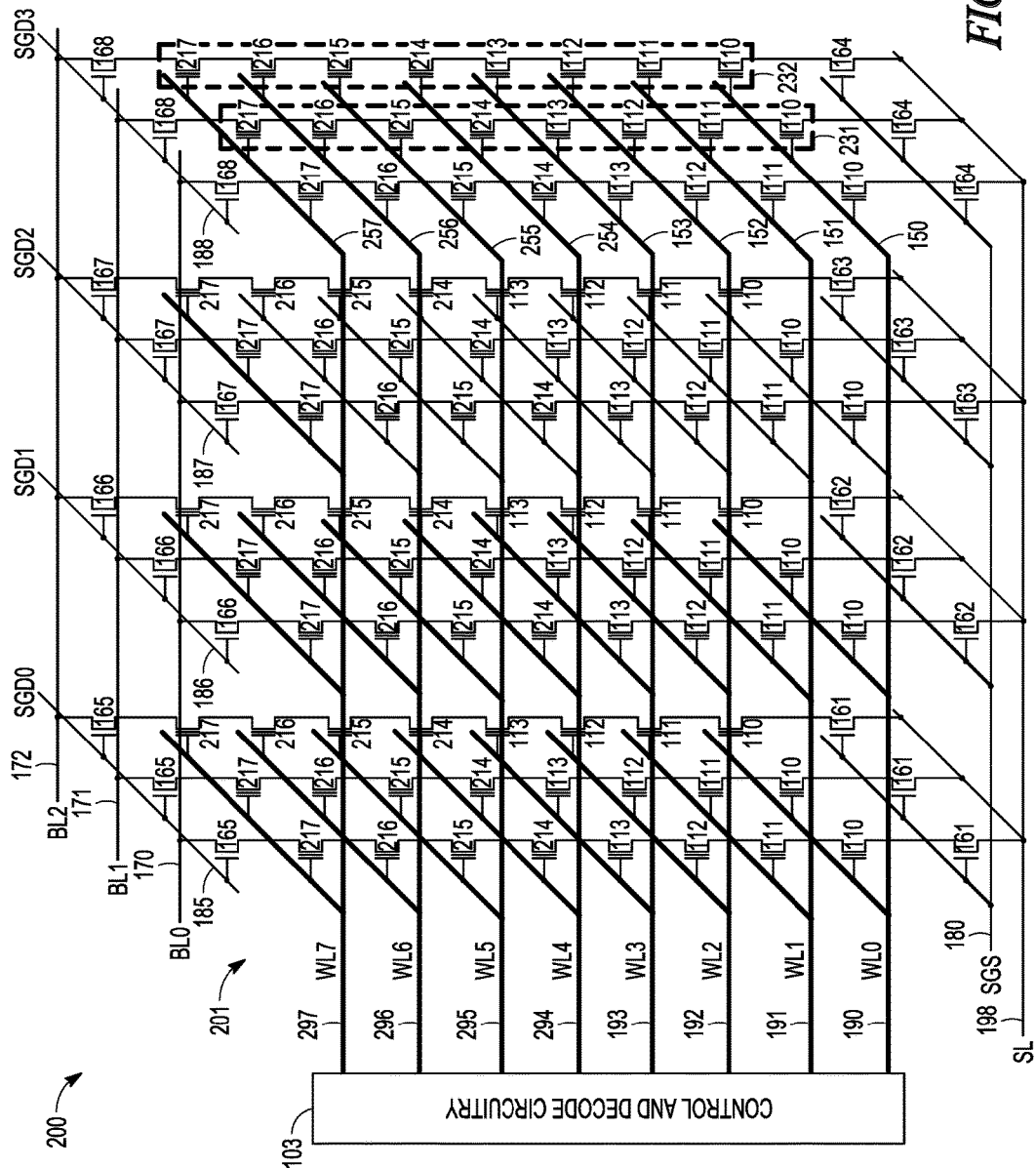
FIG. 2A shows a schematic diagram of an apparatus in the form of another memory device having a memory array, control and decode circuitry, and connections, according to an embodiment of the invention.

FIG. 2A shows a schematic diagram of an apparatus in the form of a memory device 200 having a memory array 201, control and decode circuitry 103, connections 190, 191, 192, and 193, and connections 294, 295, 296, and 297, according to an embodiment of the invention. Memory device 200 can include elements similar to or identical to those of memory device 100 of FIG. 1A. Thus, for simplicity, similar or identical elements between memory devices 100 and 100G are given the same labels and their descriptions are not repeated in the description of FIG. 2A through FIG. 2D. Some of the similar or identical elements between memory devices 100 and 200 are also not labeled in FIG. 2A through FIG. 2C.

As shown in FIG. 2A, memory device 200 can include memory cells 110, 111, 112, and 113 and memory cells 214, 215, 216, and 217 arranged in memory cell strings, such as memory cell strings 231 and 232. FIG. 1 shows an example of 12 memory cell strings and eight memory cells 110, 111, 112, 113, 214, 215, 216, and 217 in each memory cell string. The number of such memory cell strings and number of such memory cells in each memory cell string can vary.

As shown in FIG. 2A, in addition to control gates 150, 151, 152, and 153, memory device 200 can include control gates 254, 255, 256, and 257 that can carry corresponding signals WL4, WL5, WL6, and WL7, respectively. Similar to memory device 100 (FIG. 1A), control gates 150, 151, 152, and 153 and connections 190, 191, 192, and 193 of memory device 200 (FIG. 2A) can form parts of access lines of memory device 200, such that each of such access lines can include one of control gates 150, 151, 152, and 153 and/or one of connections 190, 191, 192, and 193. In memory device 200, control gates 254, 255, 256, and 257 and connections 294, 295, 296, and 297 can form parts of additional access lines of memory device 200, such that each of such additional access lines can include one of control gates 254, 255, 256, and 257 and/or one of connections 294, 295, 296, and 297. For example, an access line of memory device 200 can include control gate 254 and/or connection 294, and another access line of memory device 200 can include control gate 255 and/or connection 295. In a memory operation, memory device 200 can use signals WL4, WL5, WL6, and WL7 to control access to memory cells 214, 215, 216, and 217, respectively.

Select gates 185, 186, 187, and 188 can be coupled to control and decode circuitry 103 through connections (not shown in FIG. 2A) that can be different from connections 145, 146, 147, and 148 (FIG. 1A).

As shown in FIG. 2A, control gates 150, 151, 152, and 153 can be coupled to control and decode circuit 103 through connections 190, 191, 192, and 193, which can be the same as those in FIG. 1A. In FIG. 2A, control gates 254, 255, 256, and 257 can be coupled to control and decode circuit 102 through connections 294, 295, 296, and 297, which can be structured as conductive connections in memory device 200.

Figure 2B:
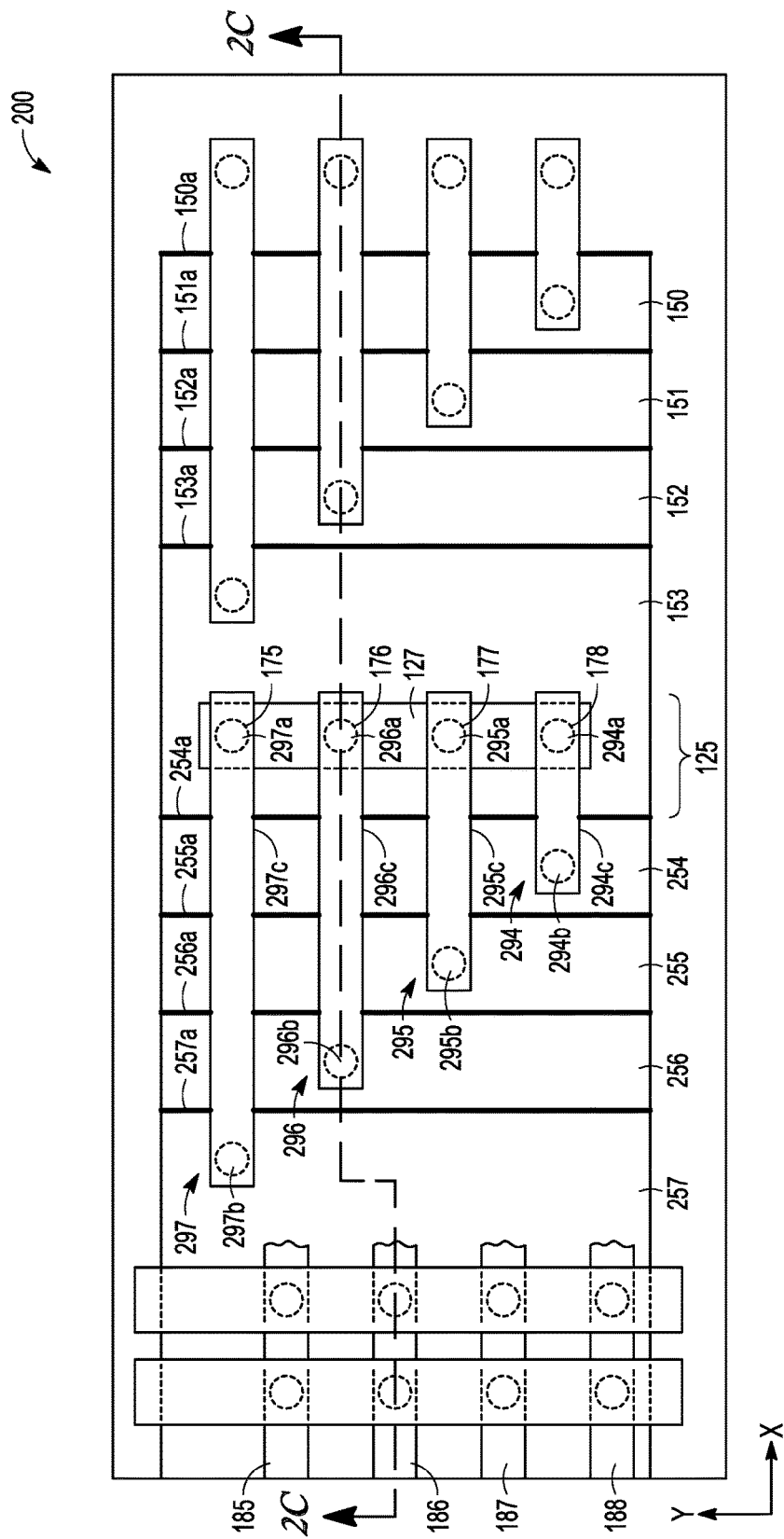
FIG. 2B and FIG. 2C show different views of a structure of a portion of the memory device of FIG. 2A, according to an embodiment of the invention.
Figure 2C:
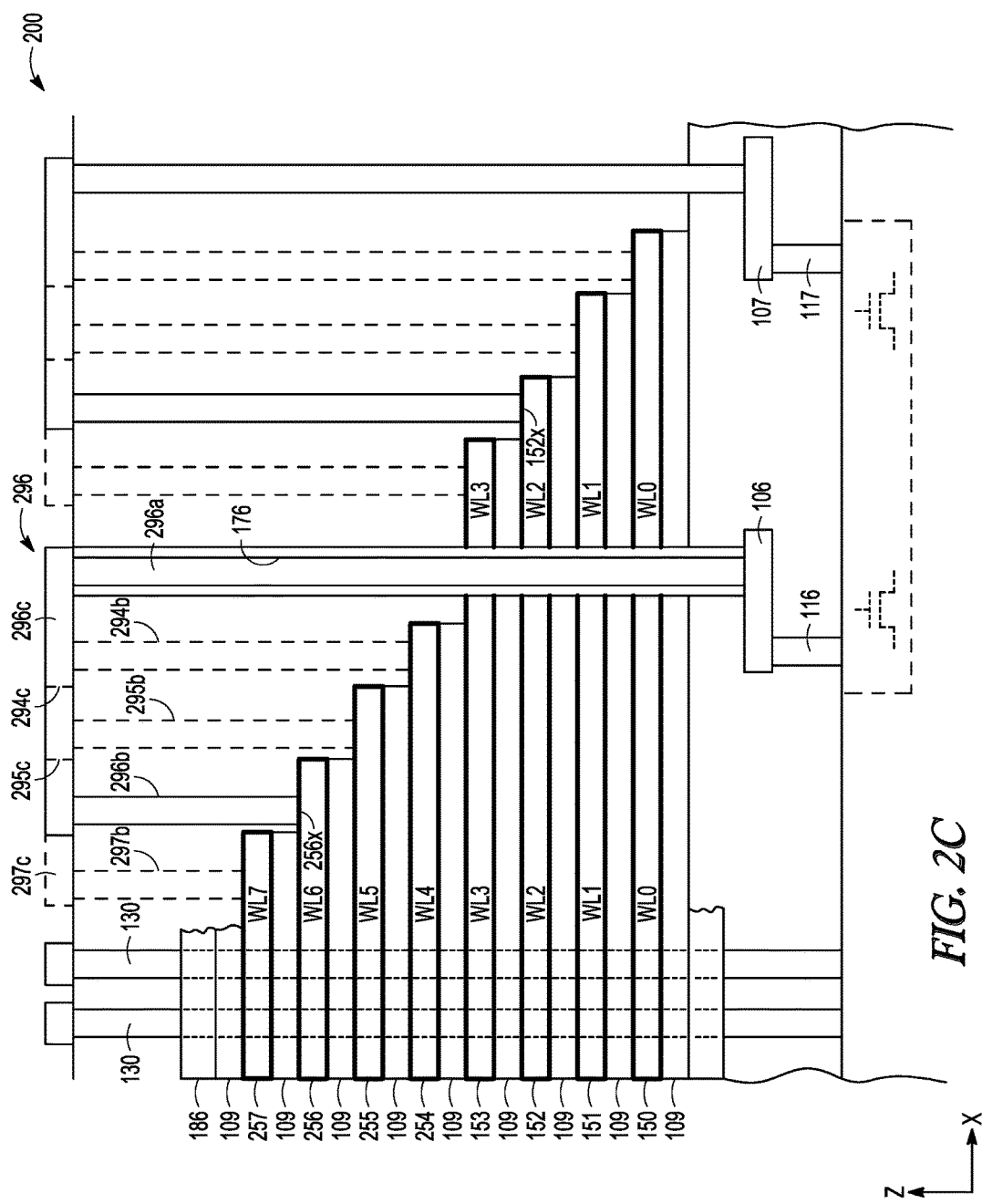

FIG. 2B shows a top view of a structure of a portion of memory device 200 of FIG. 2A, according to an embodiment of the invention. FIG. 2C shows a side view of the structure of the portion of memory device 200 along line 2C of FIG. 2B.

As shown in FIG. 2B and FIG. 2C, each of memory cell strings 231 and 232 (also shown in FIG. 2A) can include a body 130 extending outwardly from substrate 199 and through a portion of each of control gates 150, 151, 152, 153, 254, 255, 256, and 257 and a portion of each of select gates 185, 186, 187, and 188.

Dielectric material 127 and openings 175, 176, 177, and 178 can be similar to or identical to those of memory device 100 (e.g., FIG. 1B and FIG. 1C). In memory device 200 in FIG. 2B, however, openings 175, 176, 177, and 178 can contain portions of respective connections 294, 295, 296, and 297 that are coupled to control gates, such as control gates 254, 255, 256, and 257, respectively. This is different from the structure of memory device 100 in FIG. 1B where openings 175, 176, 177, and 178 in FIG. 1B can contain portions of respective connections 145, 146, 147, and 148 that are coupled to select gates 185, 186, 187, and 188, respectively. Thus, area 125 (where openings 175, 176, 177, and 178 can be located) can be between a location of edges 254a, 255a, 256a, and 257a of respective control gates 254, 255, 256, and 257 and a location of edges 150a, 151a, 152a, and 153a of respective control gates 150, 151, 152, and 153. For example, as shown in FIG. 2B, area 125 can be between edge 254a of control gate 254 and edge 153a of control gate 153.

As shown in FIGS. 2B and 2C, connection 296 can be coupled to contact area 256x of control gate 256. Connection 296 can include segments (conductive segments) 296a, 296b, and 296c. Segments 296a and 296b can be perpendicular to substrate 199. Segment 296c can be parallel to substrate 199 and can couple segment 296a to 296b. The other connections 294, 295, and 297 can be coupled to contact areas of respective control gates 254, 255, and 257. Connections 294, 295, and 297 can include respective segments 294a, 295a, and 297a, and segments 294b, 295b, and 297b, as shown in FIG. 2B and FIG. 2C.

Figure 2D:
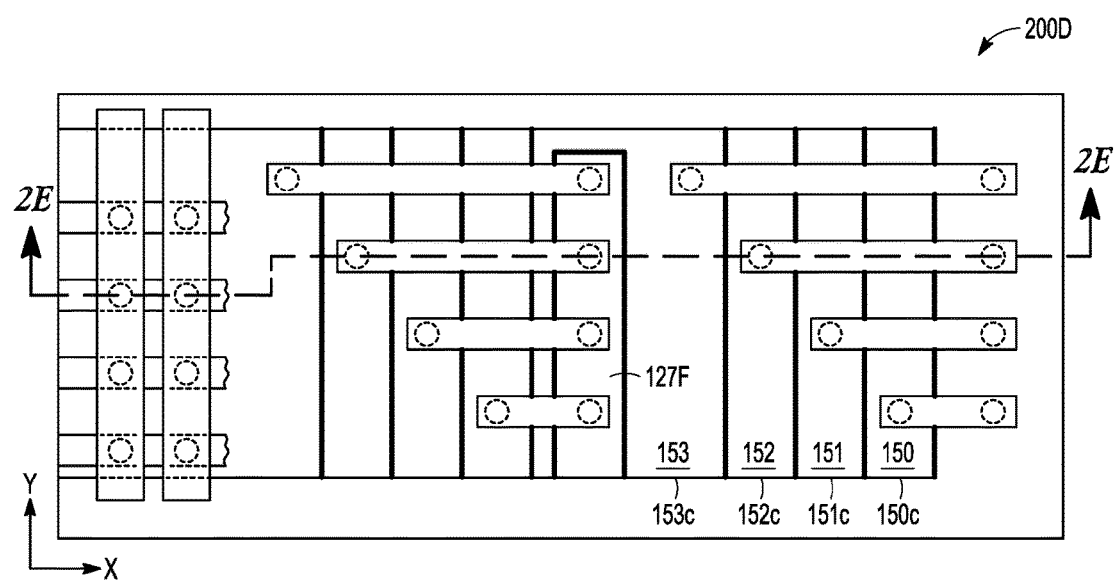
FIG. 2D and FIG. 2E show different views of a structure of a portion of another memory device, which can be a variation of the memory device of FIG. 2A through FIG. 2C, according to an embodiment of the invention.
Figure 2E:
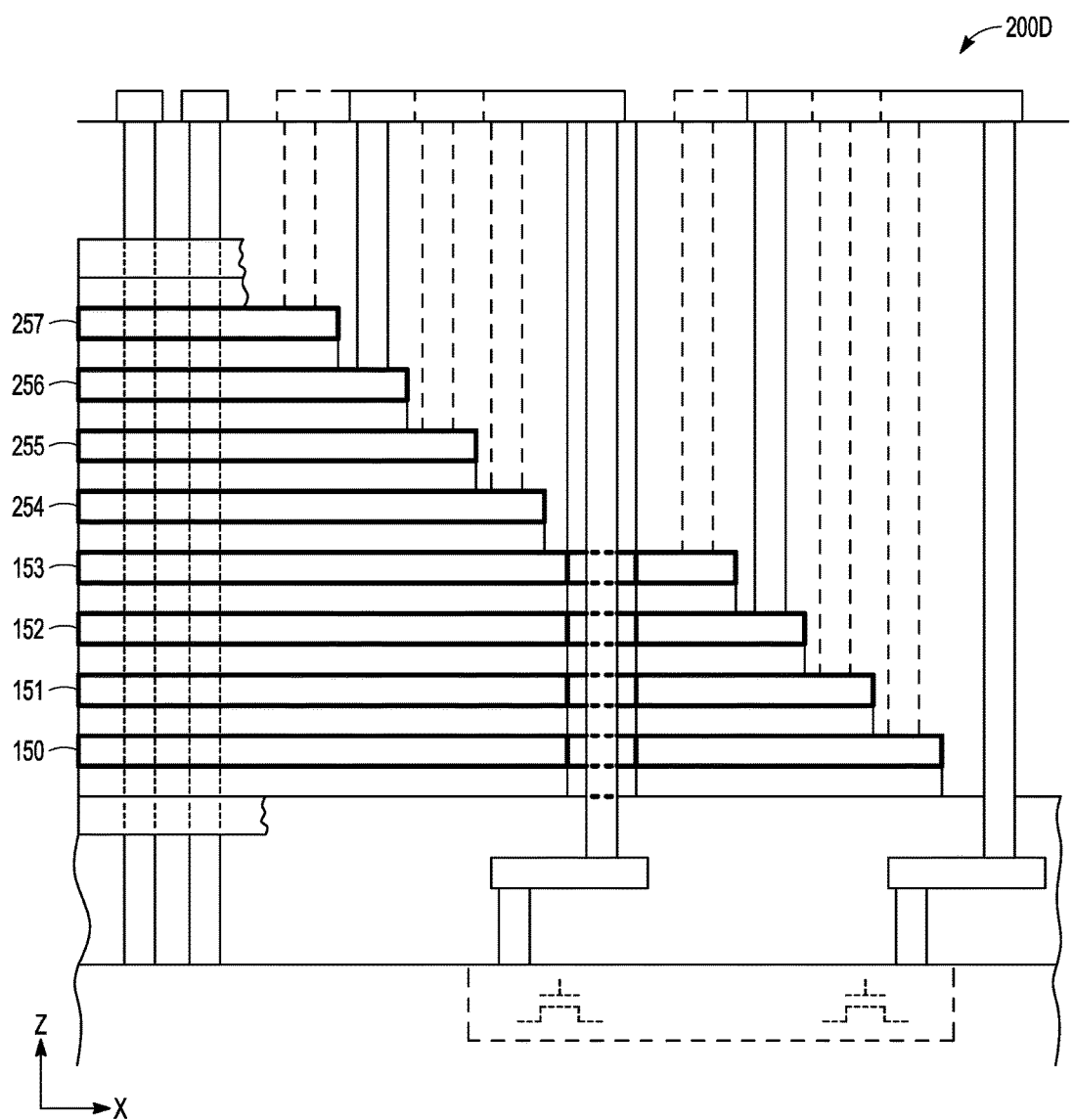

FIG. 2D shows a top view of a structure of a portion of memory device 200D, which can be a variation of memory device 200 of FIG. 2A through FIG. 2C, according to an embodiment of the invention. FIG. 2E shows a side view of the structure of the portion of memory device 200D along line 2E of FIG. 2D.

FIG. 2D and FIG. 2E can correspond to FIG. 2B through FIG. 2C, respectively. As shown in FIG. 2D through FIG. 2E, memory device 200D can include elements similar to or identical to those of memory device 200 (FIG. 2B through FIG. 2C). Thus, for simplicity, the description of similar or identical elements between memory devices 200 and 200D are not repeated in the description of FIG. 2D through FIG. 2E. Some of the similar or identical elements between memory devices 200 and 200D are also not labeled in FIG. 2D and FIG. 2E. The schematic diagram for memory devices 200 and 200D can be the same. However, structures of memory device 200 and 200D can be different.

For example, differences between memory device 200 and 200D can include differences in the structures of control gates 150, 151, 152, and 153 (FIG. 2D) of memory device 200D and material 127F. As shown in FIG. 2D, material 127F can extend to edges 150c, 151c, 152c, and 153c of control gates 150, 151, 152, and 153, respectively. In comparison to FIG. 2B, material 127 of FIG. 2B does not extend to the edges that correspond to edges 150c, 151c, 152c, and 153c of FIG. 2D. The structures of control gates 150, 151, 152, and 153 (FIG. 2D) of memory device 200D can be similar to or identical to those of control gates 150, 151, 152, and 153 of memory device 100G of FIG. 1G.

Figure 3A:
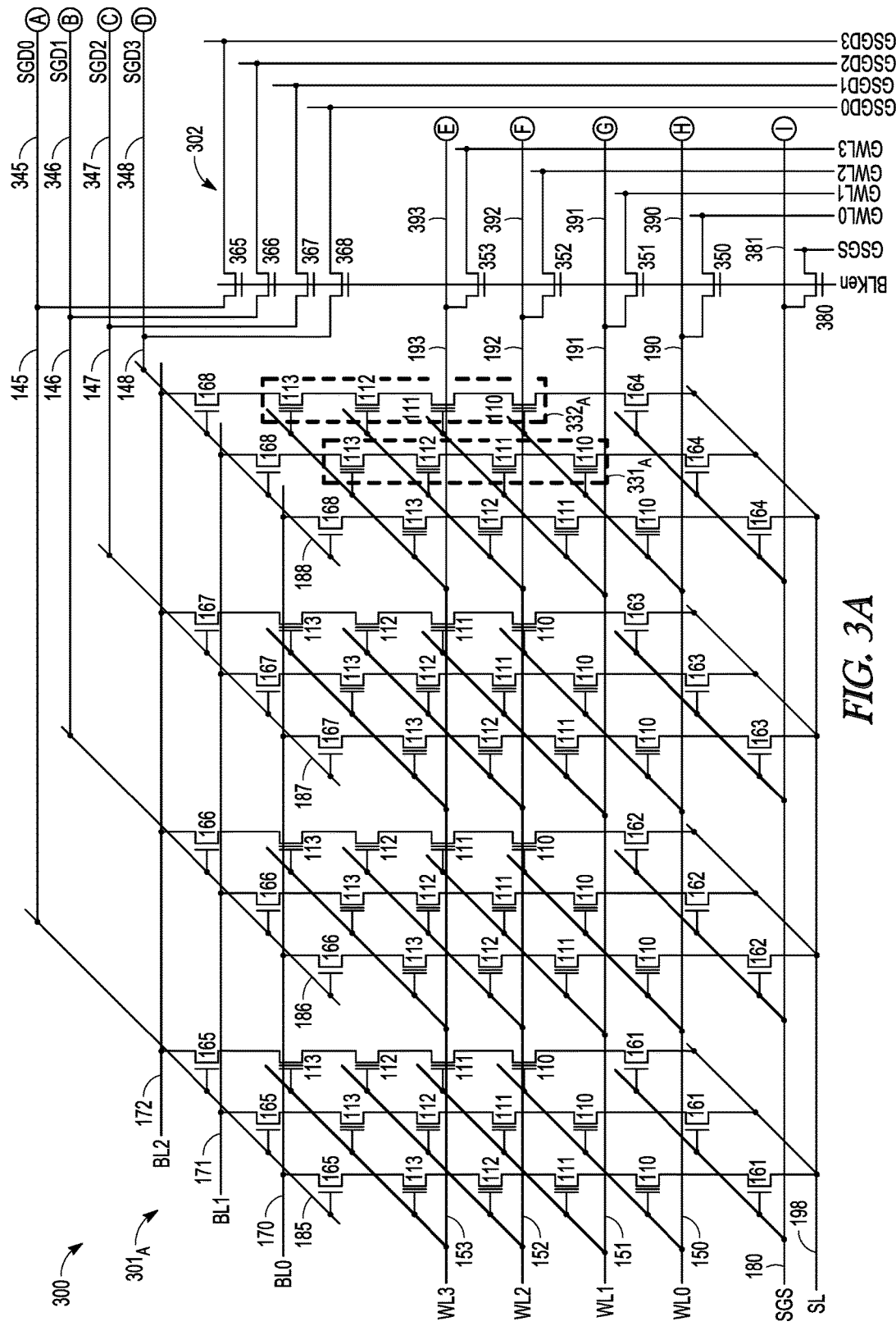
FIG. 3A and FIG. 3B show a schematic diagram of an apparatus in the form of a memory device having multiple memory arrays, according to an embodiment of the invention.
Figure 3B:
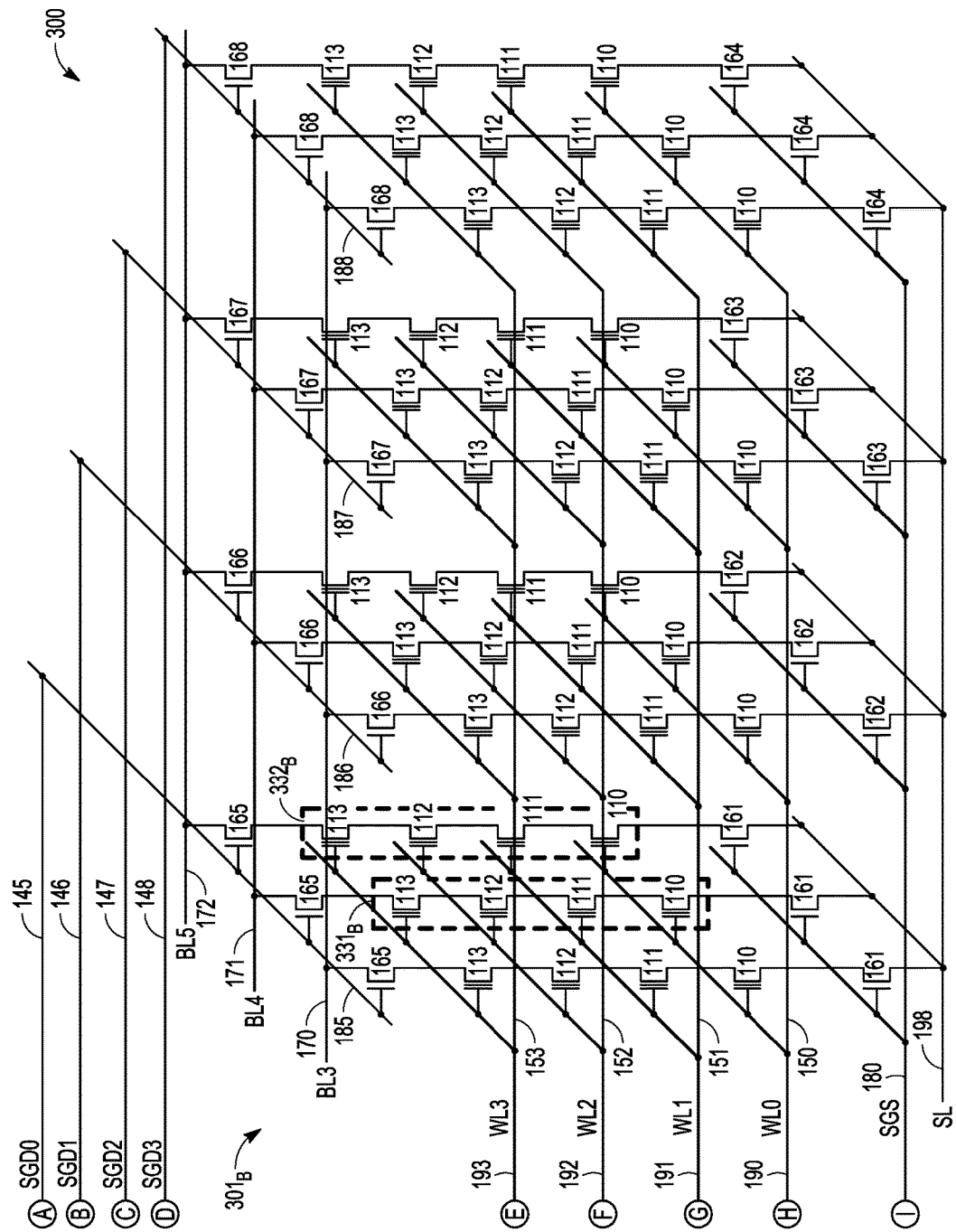

FIG. 3A and FIG. 3B show a schematic diagram of an apparatus in the form of a memory device 300 having multiple memory arrays $301_A$ and $301_B$, according to an embodiment of the invention. Points labeled "A" through "I" in FIG. 3A and FIG. 3B indicate that some elements of memory arrays $301_A$ and $301_B$ can be coupled to each other at corresponding points. For example, connection 145 of memory array $301_A$ can be coupled to connection 145 of memory array $301_B$ at corresponding points "A" in FIG. 3A and FIG. 3B.

As shown in FIG. 3A and FIG. 3B, each of memory arrays $301_A$ and $301_B$ includes connections 145, 146, 147, and 148 and connections 190, 191, 192, and 193. These connections can be similar to those of FIG. 1A. Memory array $301_A$ can include data lines 170, 171, and 172 that can carry signals BL0, BL1, and BL2. Memory arrays $301_E$ can include data lines 170, 171, and 172 that can carry signals BL3, BL4, and BL5. Memory device 300 can have a higher (e.g., double) memory capacity than that of memory device 100 of FIG. 1A. Memory device 300 can have a higher number of data lines (e.g., double) than that of memory device 100.

As shown in FIG. 3A, memory device 300 can include connections 345, 346, 347, and 348 coupled to respective connections 145, 146, 147, and 148 of memory array $301_A$ and memory array $301_B$. Memory device 300 can include connections 390, 391, 392, and 393 coupled to respective control gates 150, 151, 152, and 153 of memory array $301_A$. Memory device 300 can include a connection 381 to couple select gate 180 of memory array $301_A$ to select gate 180 of memory array $301_B$.

Memory device 300 can include circuitry 302 that can correspond to control and decode circuitry 102 of memory device 100 (FIG. 1A). Similar or identical elements between memory arrays $301_A$ and $301_E$ can share (e.g., can be controlled by) the same elements in circuitry 302. For example, select gates 185, 186, 187, and 188 of memory arrays $301_A$ and $301_B$ can share transistors 365, 366, 367, and 368, respectively, to receive signals (e.g., global drain select gate signals) GSGD0, GSGD1, GSGD2, and GSGD3 through corresponding connections 145, 146, 147, and 148.

Transistors 365, 366, 367, and 368 can be controlled by a signal BLKen (e.g., a memory block enable signal).

In another example, control gates 150, 151, 152, and 153 of memory arrays 301$_A$ and 301$_E$ can share transistors 350, 351, 352, and 353 respectively, to receive signals (e.g., global access line signals) GWL0, GWL1, GWL2, and GWL3 through corresponding connections 190, 191, 192, and 193. Transistors 350, 351, 352, and 353 can be controlled by signal BLKen.

In a further example, select gate 180 of memory arrays 301$_A$ and 301$_B$ can share transistor 380 to receive signal (e.g., global source select signal) GSGS through connection 381. Transistor 380 can be controlled by signal BLKen.

Sharing elements (e.g., transistors, interconnections, or both) as shown in memory device 300 may reduce the number of elements in memory device 300 in comparison with some conventional memory devices.

Figure 3C:
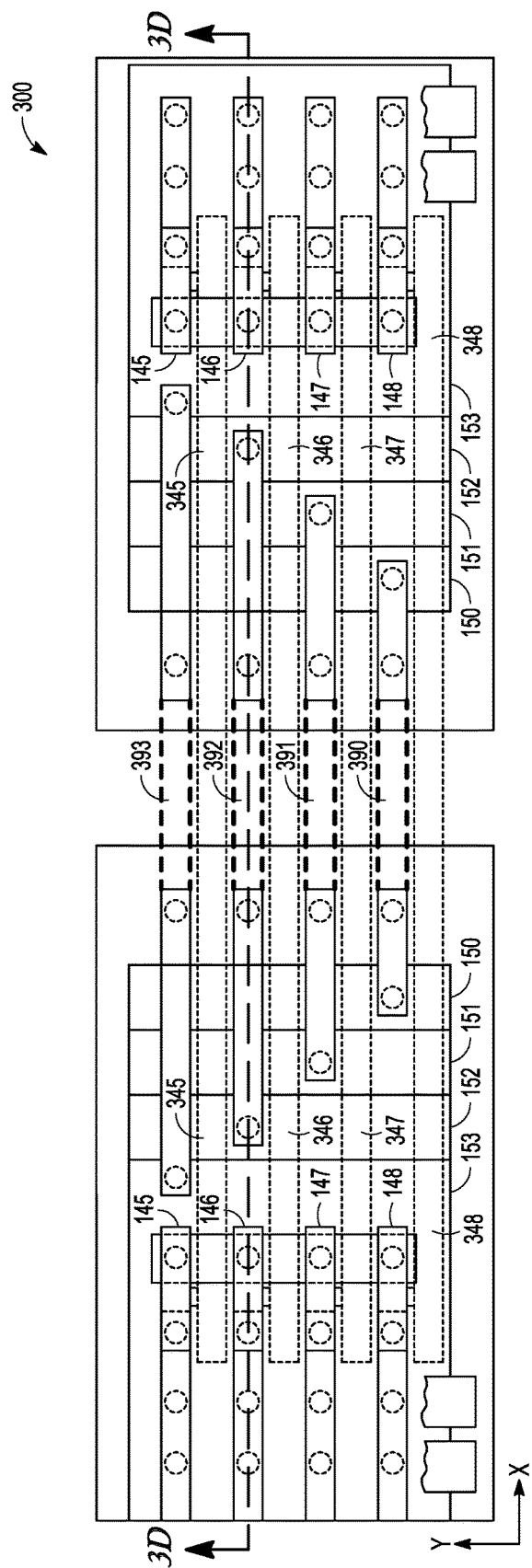
FIG. 3C and FIG. 3D show different views of a structure of a portion of the memory device of FIG. 3A and FIG. 3B, according to an embodiment of the invention.
Figure 3D:
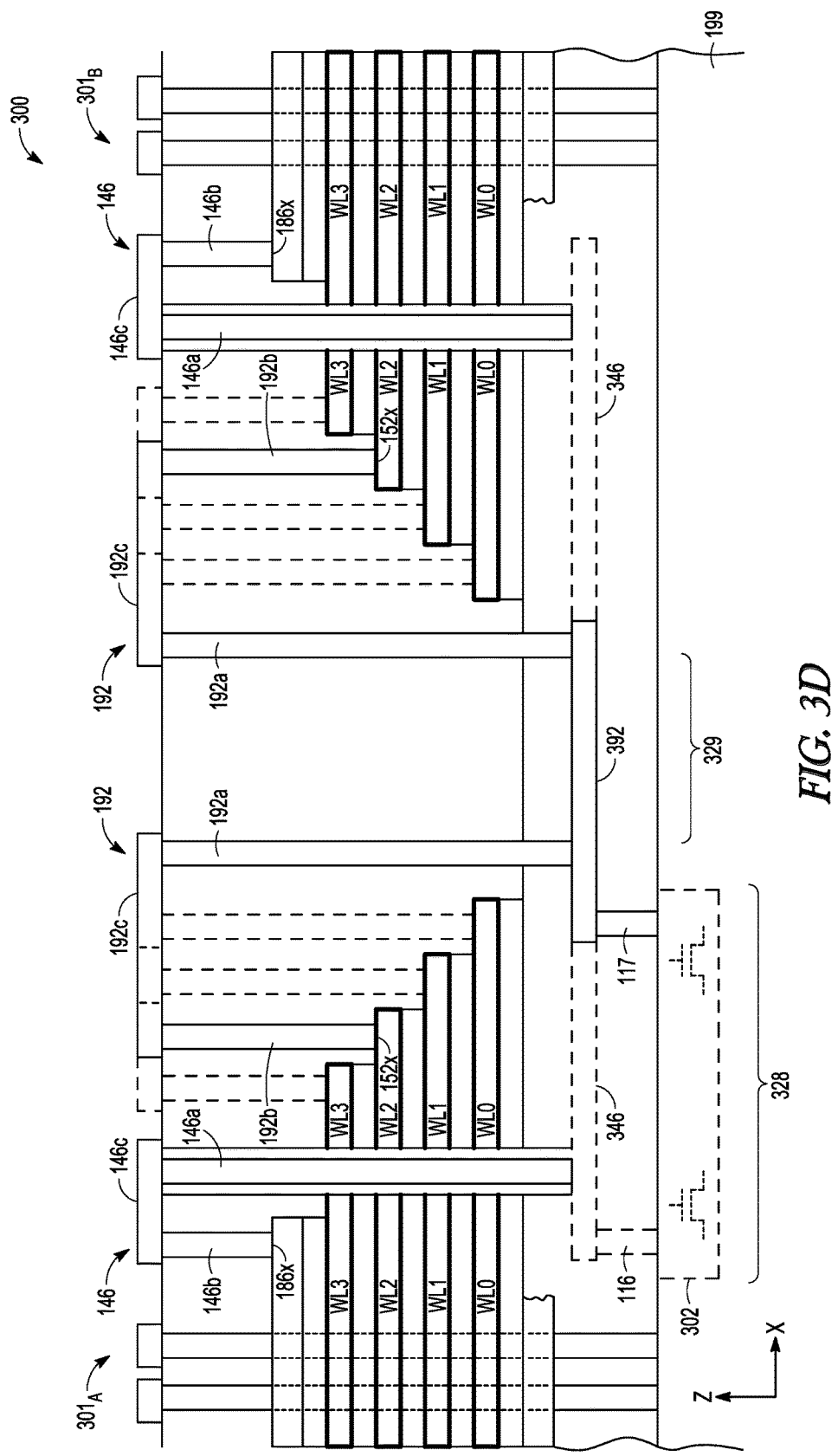

FIG. 3C shows a top view of a structure of a portion of memory device 300 of FIG. 3A and FIG. 3B, according to an embodiment of the invention. FIG. 3D shows a side view of the structure of the portion of memory device 300 along line 3D of FIG. 3C.

As shown in FIG. 3C and FIG. 3D, memory device 300 can include elements similar to or identical to those of memory device 100 of FIG. 1B and FIG. 1C. Thus, for simplicity, the description of similar or identical elements between memory devices 100 and 300 is not repeated in the description of FIG. 3C and FIG. 3D. Some of the similar or identical elements between memory devices 100 and 300 are also not labeled in FIG. 3C and FIG. 3D.

As shown in FIG. 3C and FIG. 3D, connection 146 of each of memory arrays 301$_A$ and 301$_B$ can include segments 146a, 146b, and 146c. Connection 192 in each of memory arrays 301$_A$ and 301$_B$ can include segments 192a, 192b, and 192c.

Connection 346 can include a conductive material over substrate 199. As shown in FIG. 3D, connection 346 can include a segment parallel to substrate 199 (e.g., parallel to the x-direction). Connection 346 can be coupled to segment 146a of connection 146 of each of memory arrays 301$_A$ and 301$_B$. Other connections 345, 347, and 348 (FIG. 3C) can be coupled to respective connections 145, 147, and 148.

Connection 392 can include a conductive material over substrate 199. As shown in FIG. 3D, connection 392 can include a segment parallel to substrate 199 (e.g., parallel to the x-direction). Connection 392 can be coupled to segment 192a of connection 192 of each of memory arrays 301$_A$ and 301$_B$. Other connections 390, 391, and 393 (FIG. 3C) can be coupled to respective connections 145, 147, and 148.

Circuitry 302, including some or all of transistors 350, 351, 352, 353, 365, 366, 367, 368, and 380 (FIG. 3A) can be formed in substrate 199 and directly under one of memory arrays 301$_A$ and 301$_B$ (e.g., directly under memory array 301$_A$ as shown in FIG. 3D). For example, source and drain regions of some or all of transistors 350, 351, 352, 353, 365, 366, 367, 368, and 380 can be formed in an area 328 in substrate 199. Area 328 can include an area of substrate 199 that is directly under one of memory array 301$_A$ and memory array 301$_B$.

Alternatively, circuitry 302, including some or all of transistors 350, 351, 352, 353, 365, 366, 367, 368, and 380, can be formed in an area 329 in substrate 199. As shown in FIG. 3D, area 329 can include an area in substrate 199 that can be on a side of one of memory arrays 301$_A$ and 301$_B$ (e.g., an area under and between memory array 301$_A$ or 301$_B$.)

FIG. 3B and FIG. 3C show an example where control gates 150, 151, 152, and 153 of each of memory arrays 301$_A$ and 301$_{13}$ can be similar to that of control gates 150, 151, 152, and 153 of memory device 100 (FIG. 1B). Alternatively, control gates 150, 151, 152, and 153 of each of memory arrays 301$_A$ and 301$_E$ can be similar to that of control gates 150, 151, 152, and 153 memory device 100G (FIG. 1G).

Routing connections (e.g., 345, 346, 347, 348, 390, 391, 392, 393, and 381) as described above with reference to FIG. 3A through FIG. 3D may improve (e.g., reduce) the number, the lengths, or both, of interconnections in the memory array. Fabricating process cost associated with the memory device may also be improved (e.g., reduced). Further, sharing elements (e.g., transistors 350, 352, 352, 353, 365, 366, 367, 368, and 380) may reduce decoding function (e.g., in a read or write operation) in a memory device, such as memory device 300.

Figure 4A:
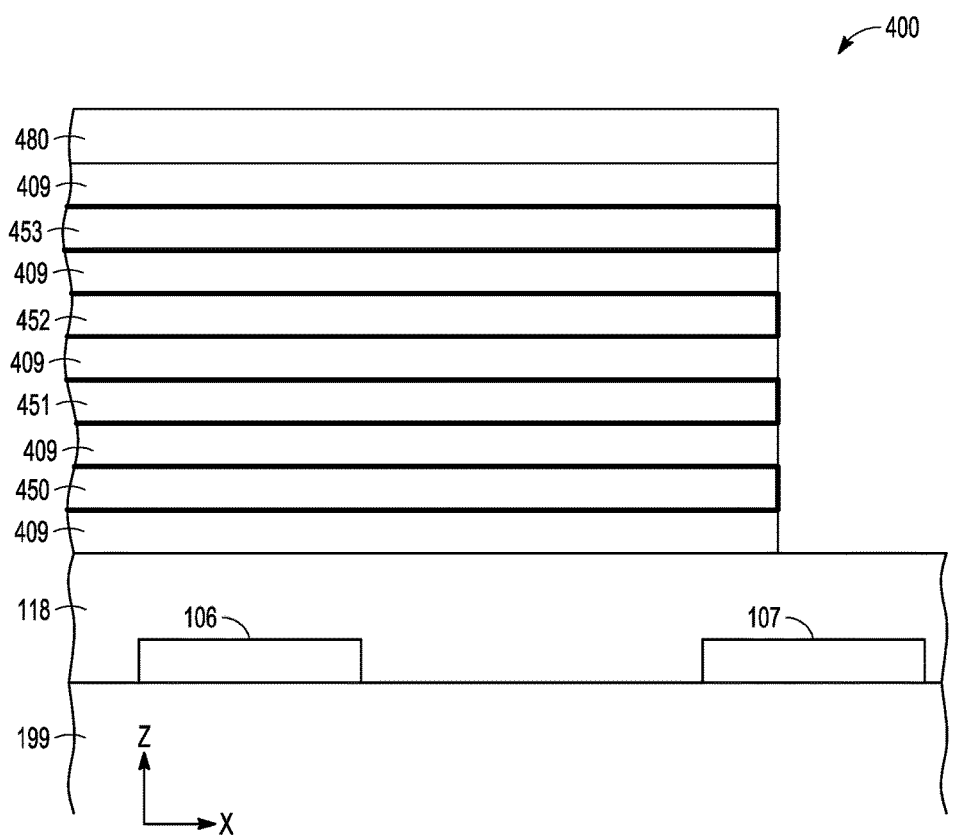
FIG. 4A through FIG. 4N show processes of forming a memory device having connections coupling select gates to other elements of the memory device, according to an embodiment of the invention.
Figure 4B:
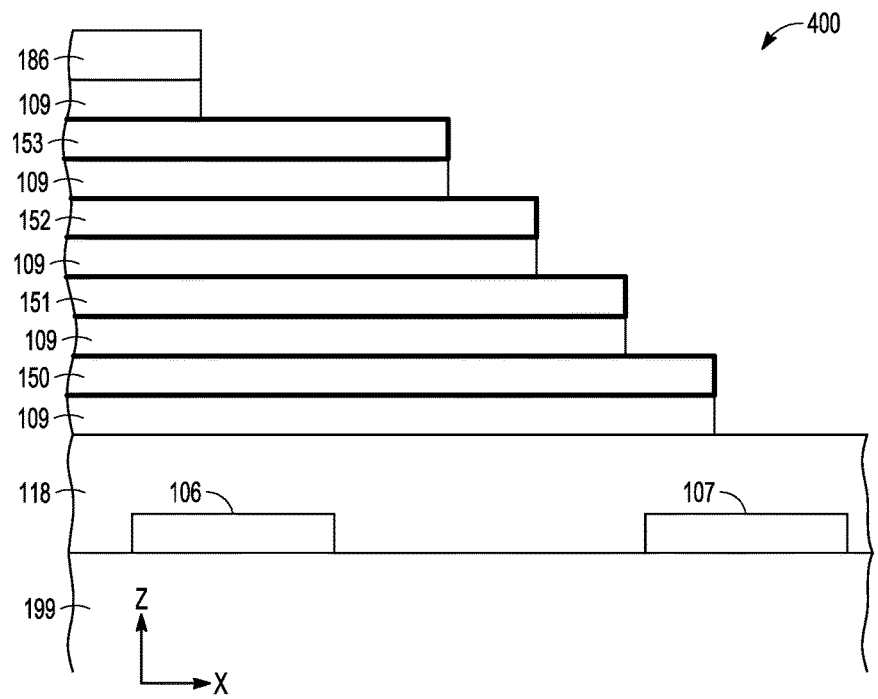
Figure 4C:
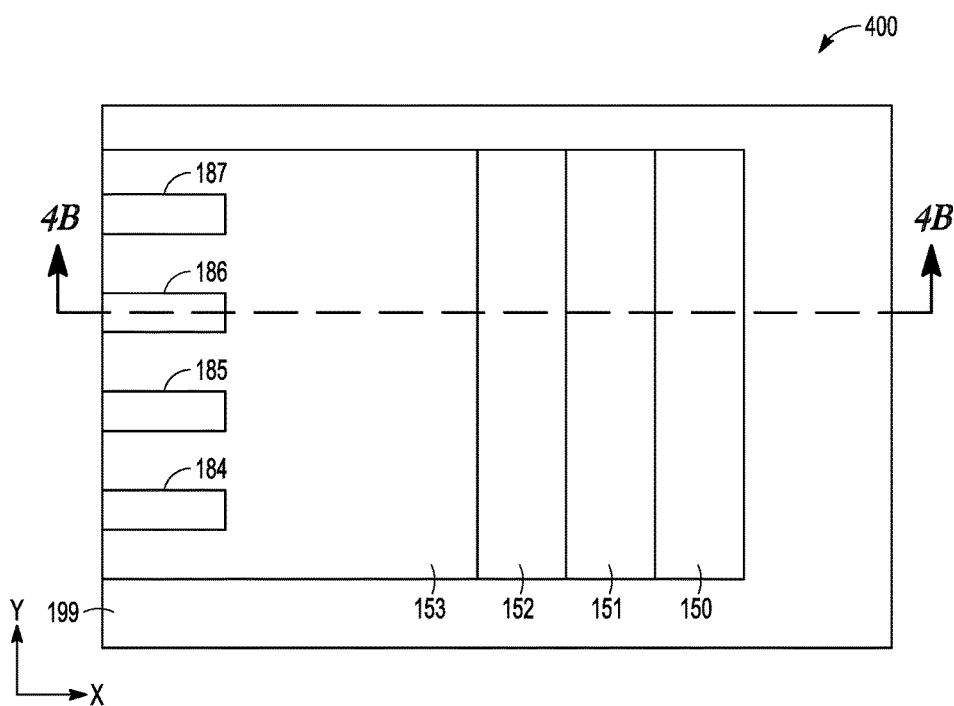
Figure 4D:
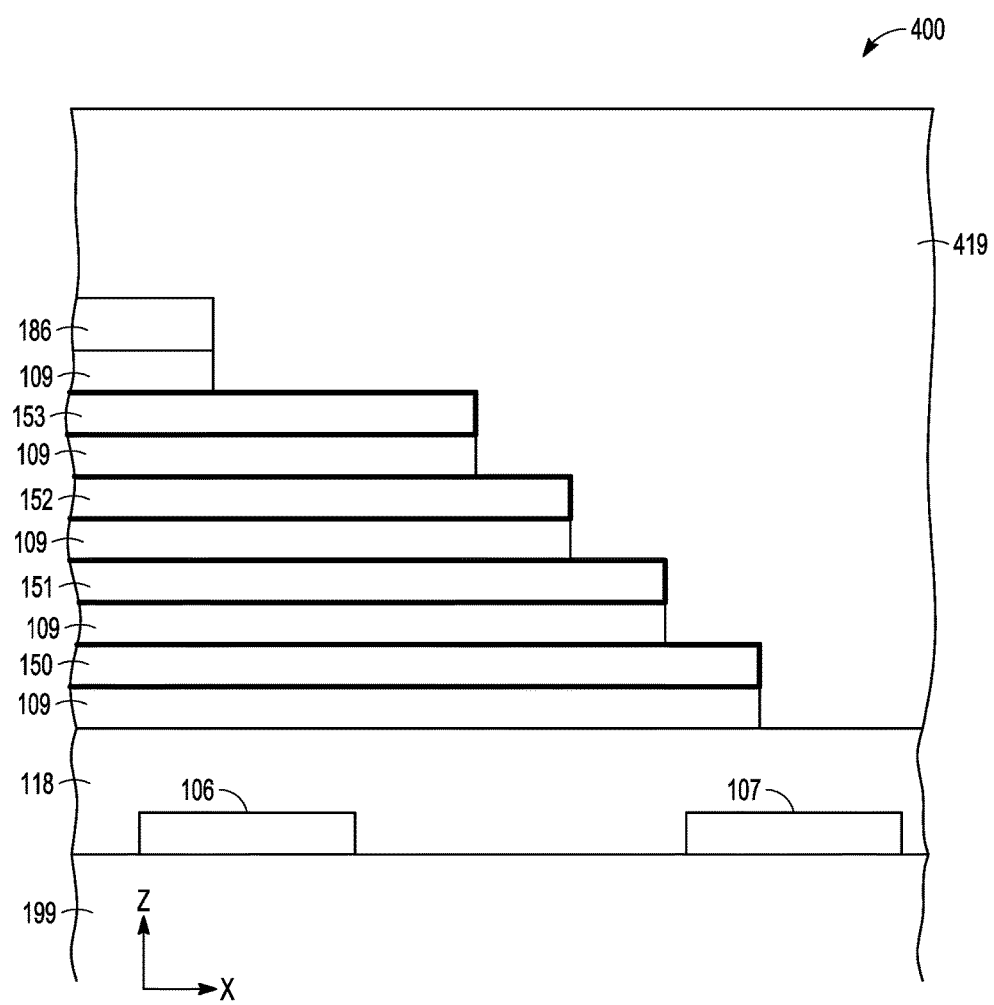
Figure 4E:
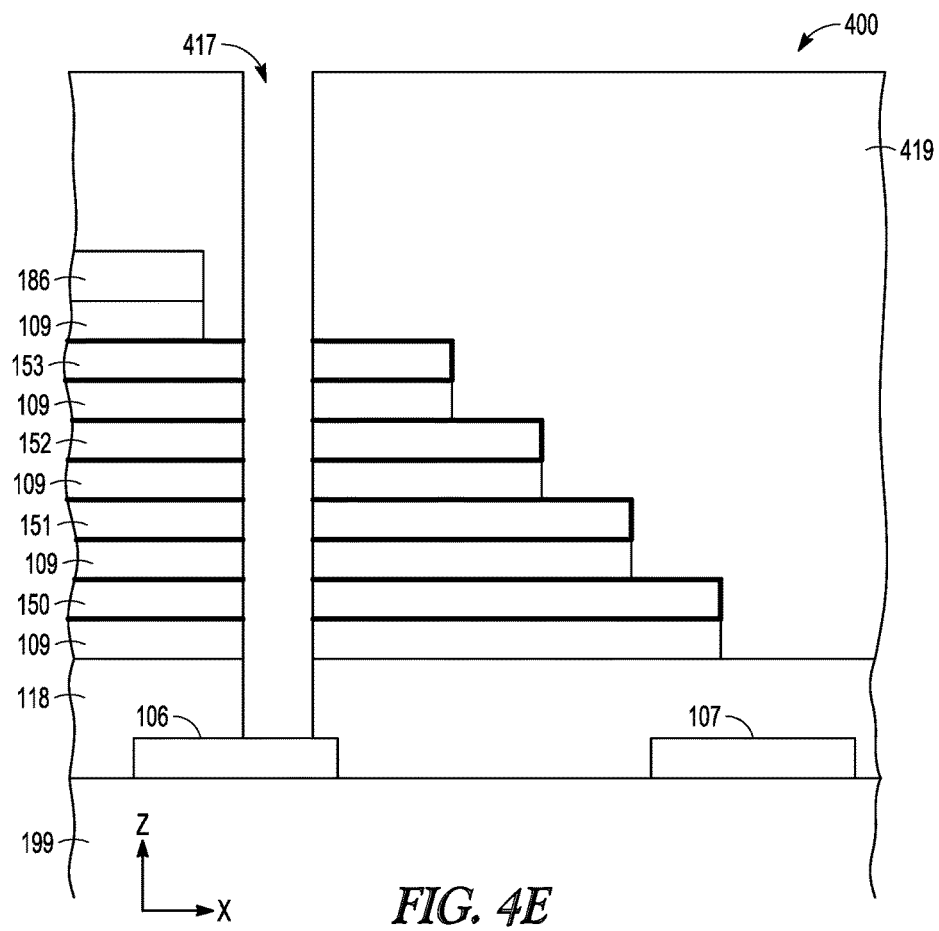
Figure 4F:
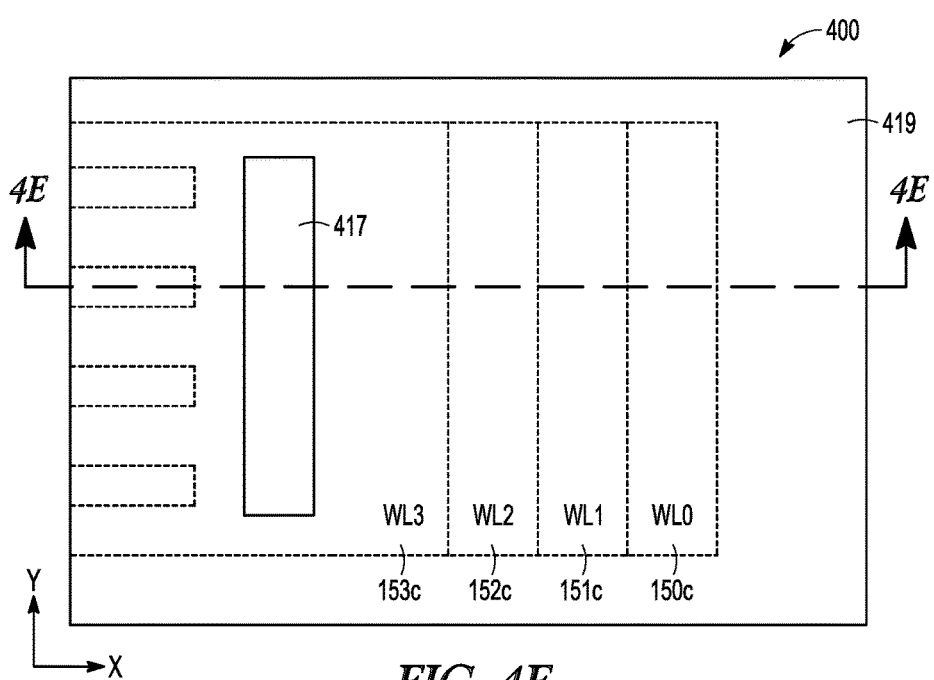
Figure 4G:
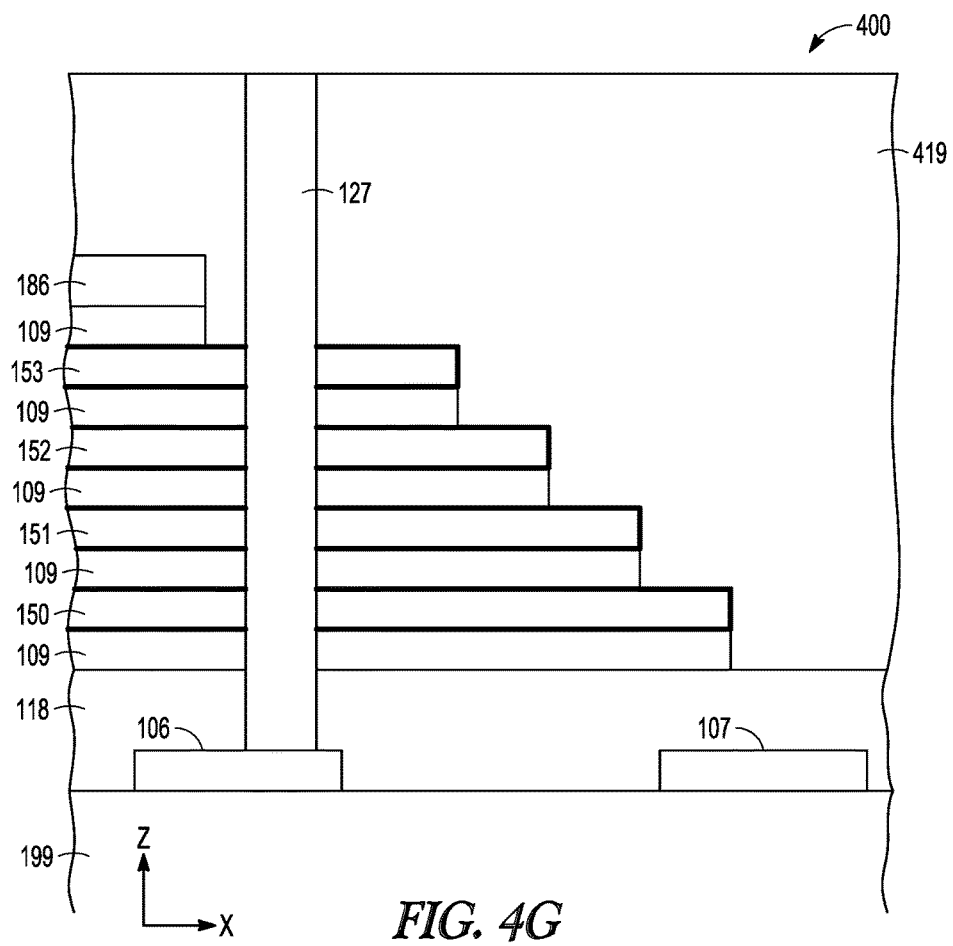
Figure 4H:
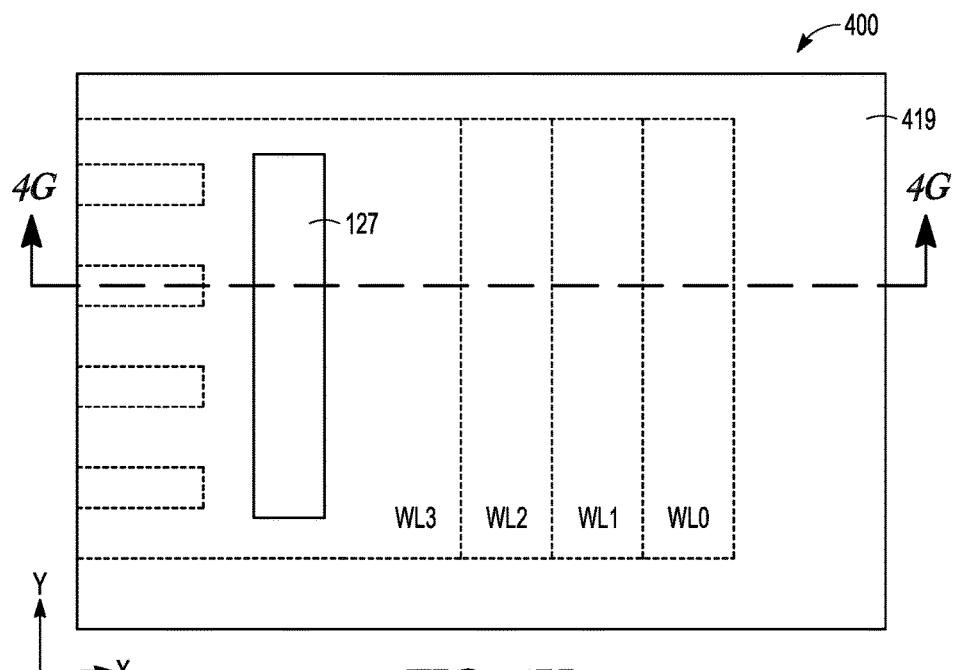
Figure 4I:
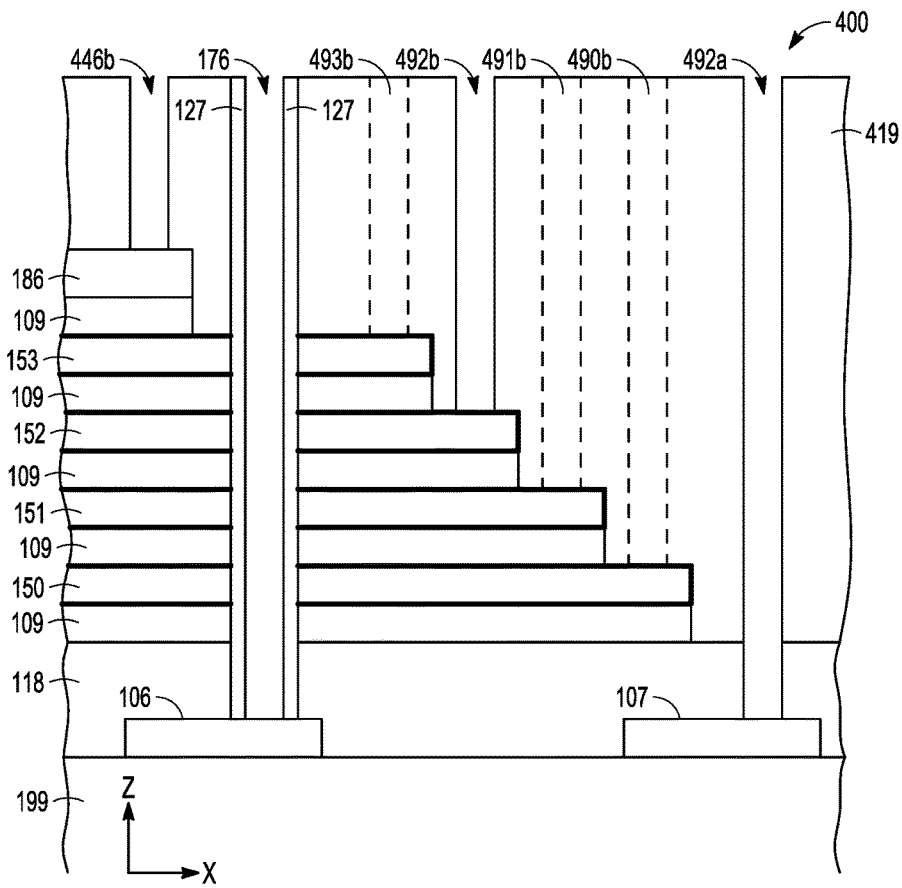
Figure 4J:
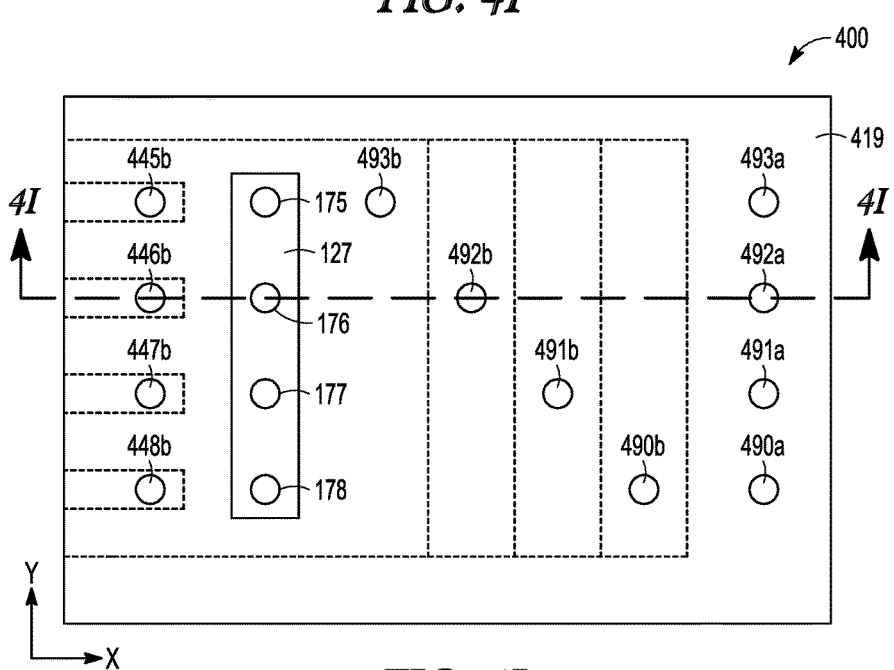
Figure 4K:
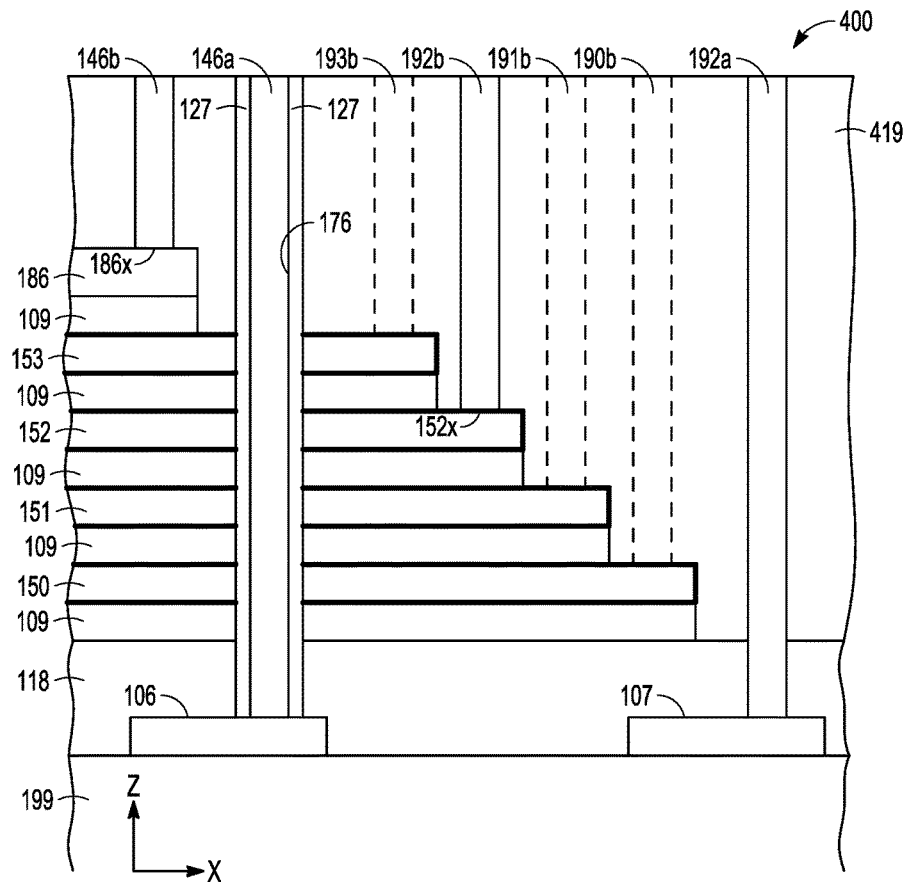
Figure 4L:
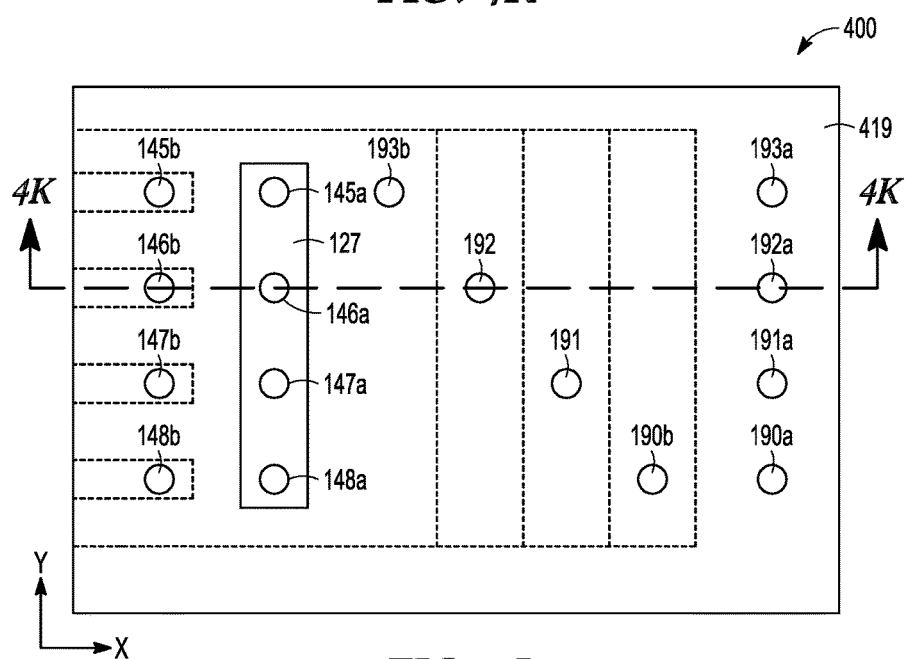
Figure 4M:
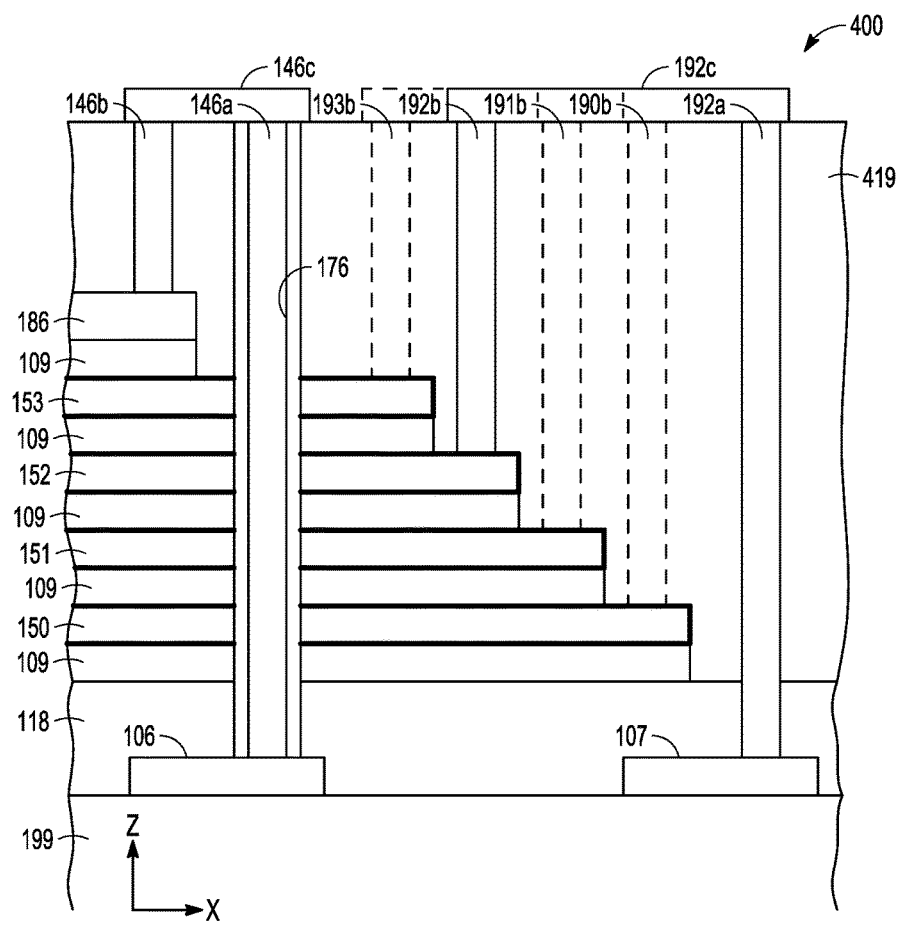
Figure 4N:
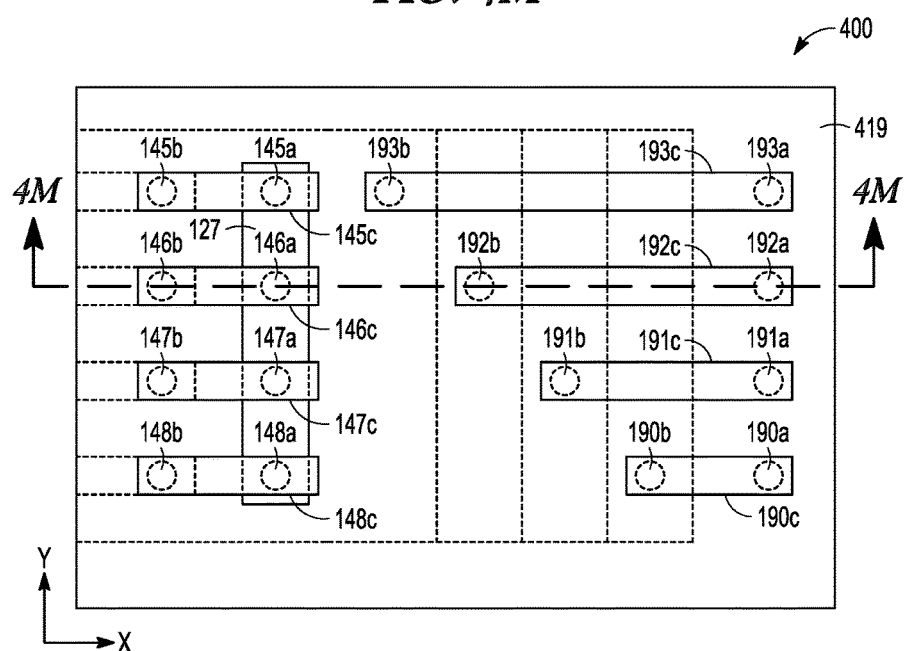

FIG. 4A through FIG. 4N show processes of forming a memory device 400 having select gates coupled to other elements by using connections going through openings in control gates, according to an embodiment of the invention. The processes of forming a memory device 400 can be used to form memory device 100 (FIG. 1A though FIG. 1F). Thus, in the following description, similar or identical elements between memory device 400 and memory device 100 are given the same labels. FIG. 4A shows a portion of memory device 400 having a substrate 199 and conductive contacts 106 and 107 and dielectric material 118 formed over substrate 199. One skilled in the art would recognize that memory device 400 includes other elements that are not shown in FIG. 4A.

FIG. 4A shows memory device 400 after materials 409, 450, 451, 452, 453, and 480 have been formed. Forming these materials can include alternately depositing materials 109 and materials 450, 451, 452, and 453, such that they can be arranged in a stack (e.g., one layer over another), as shown in FIG. 4A. Materials 409 can include dielectric material(s) (e.g., an oxide of silicon or other dielectric material). Materials 450, 451, 452, 453, and 480 can include conductive material(s).

FIG. 4B and FIG. 4C show memory device 400 after select gates 184, 185, 186, and 187, control gates 150, 151, 152, and 153, and dielectric materials 109 have been formed. FIG. 4C shows a top view of memory device 400 of FIG. 4B. FIG. 4B shows a side view of memory device 400 along line 4B of FIG. 4B. Select gates 184, 185, 186, and 187 (FIG. 4C) can be formed by removing (e.g., etching) part of material 480 (FIG. 4A). Control gates 150, 151, 152, and 153 and dielectric materials 109 can be formed by removing (e.g., etching) part of materials 450, 451, 452, and 453, and 409 (FIG. 4A) such that the remaining parts of these materials can include a staircase configuration, as show in FIG. 4B.

FIG. 4D shows memory device 400 after a material 419 has been formed. Forming material 419 can include depositing a dielectric material over select gates 184, 185, 186, and 187 and control gates 150, 151, 152, and 153.

FIG. 4E shows memory device 400 after an opening 417 has been formed through material 419, select gates 185, 186, 187, and 188, and control gates 150, 151, 152, and 153. FIG. 4F shows a top view of memory device 400 of FIG. 4E. FIG. 4E shows a side view of memory device 400 along line 4E of FIG. 4F. Opening 417 can be formed such that at least a portion of conductive contact 106 can be exposed through opening 417, as illustrated in FIG. 4E. Forming opening 417 can include removing (e.g., etching, drilling, or other techniques) part of each of materials 419, select gates 184, 185, 186, and 187 and control gates 150, 151, 152, and 153 to expose at least a portion of conductive contact 106 through opening 417.

In an alternative process, opening 417 can be formed such that it can extend to edges 150*c*, 151*c*, 152*c*, and 153*c*. In such an alternative process, control gates 150, 151, 152, and 153 could have structures similar to those shown in FIG. 1I and FIG. 1J.

FIG. 4G shows memory device 400 after a dielectric material 127 has been formed in opening 417. FIG. 4H shows a top view of memory device 400 of FIG. 4G. FIG. 4G shows a side view of memory device 400 along line 4G of FIG. 4H. Forming dielectric material 127 can include filling (e.g., by deposition) opening 417 with an oxide of silicon or other dielectric material.

FIG. 4I and FIG. 4J show memory device 400 after openings 175, 176, 177, and 178, openings 445*b*, 446*b*, 447*b*, and 448*b*, openings 490*a*, 491*a*, 492*a*, and 493*a*, and openings 490*b*, 491*b*, 492*b*, and 493*b* have been formed. FIG. 4J shows a top view of memory device 400 of FIG. 4I. FIG. 4I shows a side view of memory device 400 along line 4I of FIG. 4J. Forming the openings 175, 176, 177, and 178 can include removing (e.g., etching, drilling, or other techniques) part of dielectric material 127. Each of openings 175, 176, 177, and 178 can go through a portion of each of the control gates 150, 151, 152, and 153. Openings 175, 176, 177, and 178 can be formed such that at least a portion of conductive contact 106 can be exposed through one of openings 175, 176, 177, and 178 and coupled to a bottom of that opening. For example, at least a portion of conductive contact 106 can be exposed through opening 176 and coupled to the bottom of opening 176. Memory device 400 can include other conductive contacts (not shown) similar to conductive contact 106. At least a portion of each of the other conductive contacts can be exposed through a corresponding opening (e.g., one of openings 175, 177, and 178) and coupled to the bottom of the corresponding opening.

Forming the openings 445*b*, 446*b*, 447*b*, and 448*b* can include removing (e.g., etching, drilling, or other techniques) part of dielectric material 419. Openings 445*b*, 446*b*, 447*b*, and 448*b* can be formed such that at least a portion of each of select gates 184, 185, 186, and 187 can be exposed through a corresponding opening among openings 175, 176, 177, and 178 and coupled to a bottom of that opening. For example, as shown in FIG. 4I, at least a portion of select gate 186 can be exposed through opening 446*b* and coupled to the bottom of opening 446*b*.

Forming the openings 490*a*, 491*a*, 492*a*, and 493*a*, and openings 490*b*, 491*b*, 492*b*, and 493*b* can include removing (e.g., etching, drilling, or other techniques) part of dielectric material 419. As shown in FIG. 4I, openings 490*a*, 491*a*, 492*a*, and 493*a*, and openings 490*b*, 491*b*, 492*b*, and 493*b* may not go through control gates 150, 151, 152, and 153. Memory device 400 can include other conductive contracts (not shown) similar to conductive contact 107. At least a portion of each of the other conductive contacts can be exposed through a corresponding opening (e.g., one of openings 490*a*, 491*a*, 492*a*, and 493*a*) and coupled to the bottom of the corresponding opening.

FIG. 4K shows memory device 400 after segments (e.g., conductive segments) 145*a*, 146*a*, 147*a*, and 148*a*, segments 145*b*, 146*b*, 147*b*, and 148*b*, segments 190*a*, 191*a*, 192*a*, 193*a*, segments 190*b*, 191*b*, 192*b*, and 193*b* have been formed. FIG. 4L shows a top view of memory device 400 of FIG. 4K. FIG. 4K shows a side view of memory device 400 along line 4K of FIG. 4L. Forming the segments can include filling (e.g., by deposition) openings 175, 176, 177, and 178, openings 490*a*, 491*a*, 492*a*, and 493*a*, and openings 490*b*, 491*b*, 492*b*, and 493*b* with a conductive material (metal or other conductive material). Some of the segments can contact select gates 185, 186, 187, and 188 and control gates 150, 151, 152, and 153 at respective contact areas. For example, as shown in FIG. 4K, segment 146*b* can contact area 186*x* of select gate 186. Segment 192*b* can contact area 152*x* of control gate 152.

FIG. 4M shows memory device 400 after segments (e.g., conductive segments) 145*c*, 146*c*, 147*c*, and 148*c*, and 190*c*, 191*c*, 192*c*, and 193*c* have been formed. FIG. 4N shows a top view of memory device 400 of FIG. 4M. FIG. 4M shows a side view of memory device 400 along line 4M of FIG. 4N. As shown in FIG. 4N, segments 145*c*, 146*c*, 147*c*, and 148*c* can be formed to couple segments 145*a*, 146*a*, 147*a*, and 148*a* to segments 145*b*, 164*b*, 147*b*, and 148*b*, respectively. Segments 190*c*, 191*c*, 192*c*, and 193*c* can be formed to couple segments 190*a*, 191*a*, 192*a*, and 193*a* to segments 190*b*, 191*b*, 192*b*, and 193*b*, respectively.

FIG. 5A through FIG. 5G show processes of forming a memory device 500 having a group of control gates 254, 255, 256, and 257 coupled to other elements (e.g. circuitry in substrate 199) by connections having segments going through openings in other control gates 150, 151, 152, and 153, according to an embodiment of the invention. Some of the processes used to form memory device 500 can be similar to or identical to the processes used to form memory device 400 described above with reference to FIG. 4A to FIG. 4N. The processes of forming a memory device 500 can be used to form memory device 200 (FIG. 2A though FIG. 2C). Thus, detailed description of similar or identical processes or elements among memory devices 200, 400, and 500 are not repeated in the description of FIG. 5A through FIG. 5D.

Figure 5A:
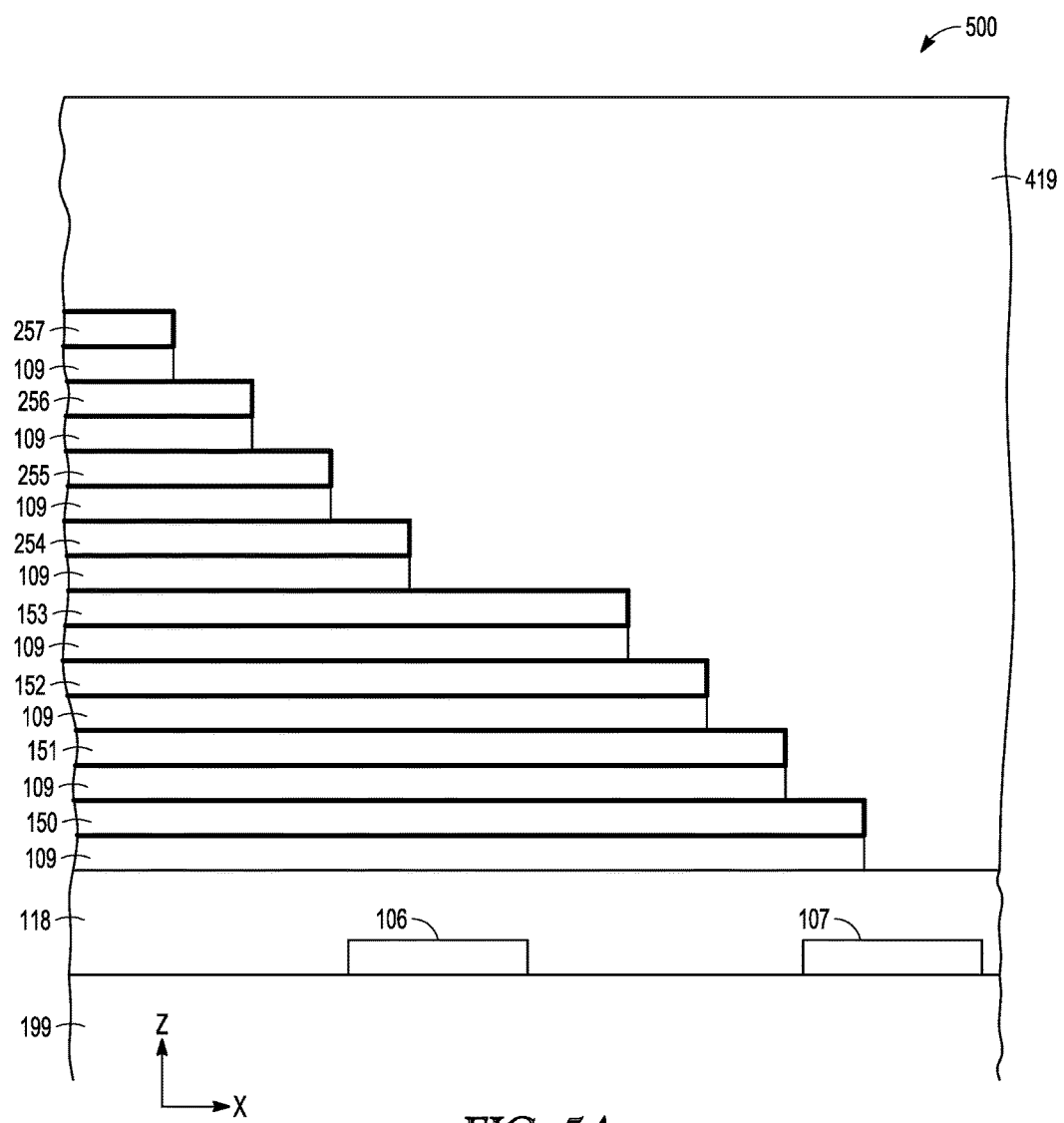
FIG. 5A through FIG. 5G show processes of forming a memory device having connections coupling a group of control gates to other elements of the memory device, according to an embodiment of the invention.

FIG. 5A shows a portion of memory device 500 after a stack of dielectric material 109, control gates 150, 151, 152, and 153 and control gates 254, 255, 256, and 257 have been formed over substrate 199 and conductive contacts 106 and 107. FIG. 5A also shows memory device 500 after material 419 has been formed over control gates 150, 151, 152, and 153 and control gates 254, 255, 256, and 257. Control gates 254, 255, 256, and 257 can be formed using processes similar those of forming control gates control gates 150, 151, 152, and 153 (FIG. 4A and FIG. 4B), such that 254, 255, 256, and 257 can include staircase configuration, as show in FIG. 5A.

Figure 5B:
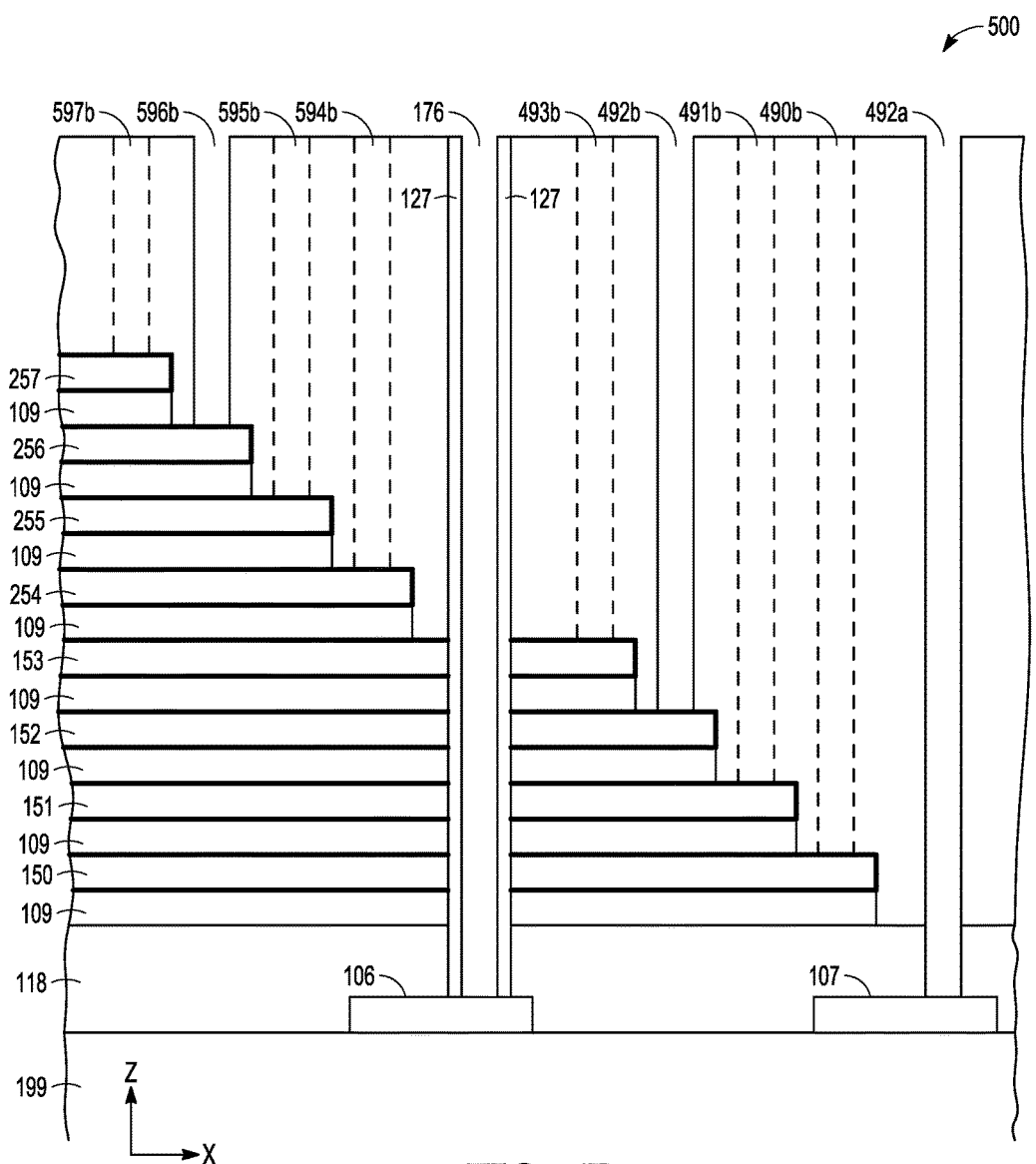
Figure 5C:
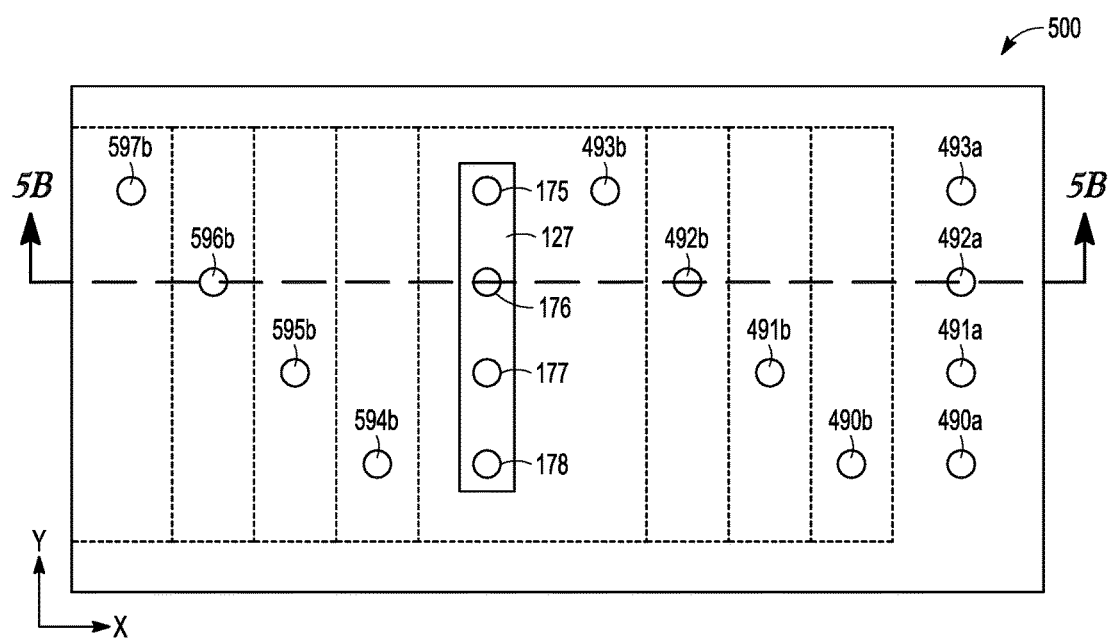

FIG. 5B and FIG. 5C show memory device 500 after openings 175, 176, 177, and 178 have been formed in dielectric material 127 through control gates 150, 151, 152, and 153. FIG. 5C shows a top view of memory device 500 of FIG. 5B. FIG. 5B shows a side view of memory device 500 along line 5B of FIG. 5C.

FIG. 5B and FIG. 5C also show memory device 500 after openings 490*a*, 491*a*, 492*a*, 493*a*, and openings 490*b*, 491*b*, 492*b*, and 493*b* have been formed in dielectric material 419. FIG. 5B and FIG. 5C further show memory device 500 after openings 175, 176, 177, and 178 and openings 594*b*, 595*b*, 596*b*, and 597*b* have been formed in dielectric material 419 and coupled to gates 254, 255, 256, and 267. Openings 594*b*, 595*b*, 596*b*, and 597*b* can be formed using processes similar those of forming openings 490*a*, 491*a*, 492*a*, and 493*a* and openings 490*b*, 491*b*, 492*b*, and 493*b* (FIG. 4I and FIG. 4J).

Figure 5D:
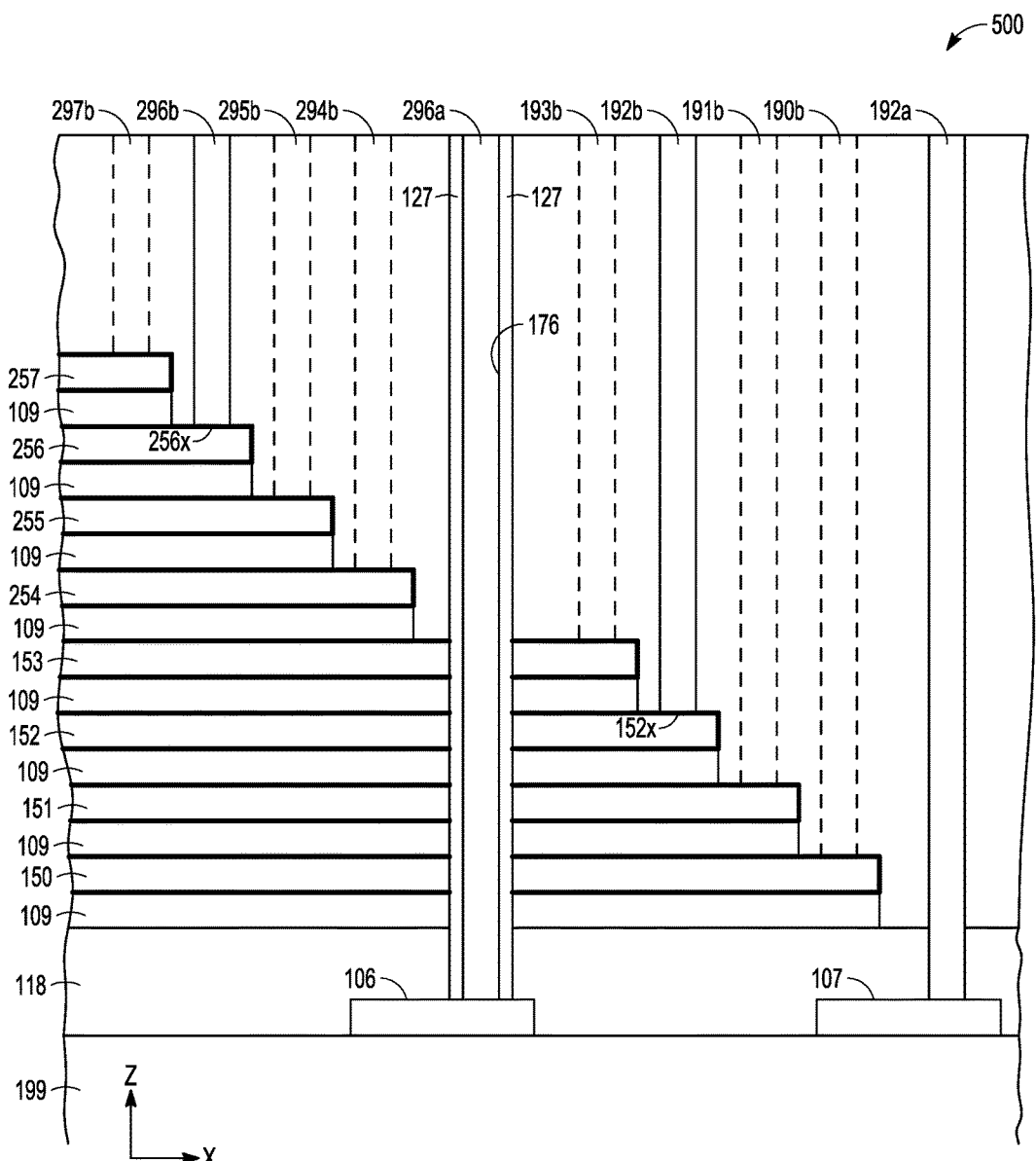
Figure 5E:
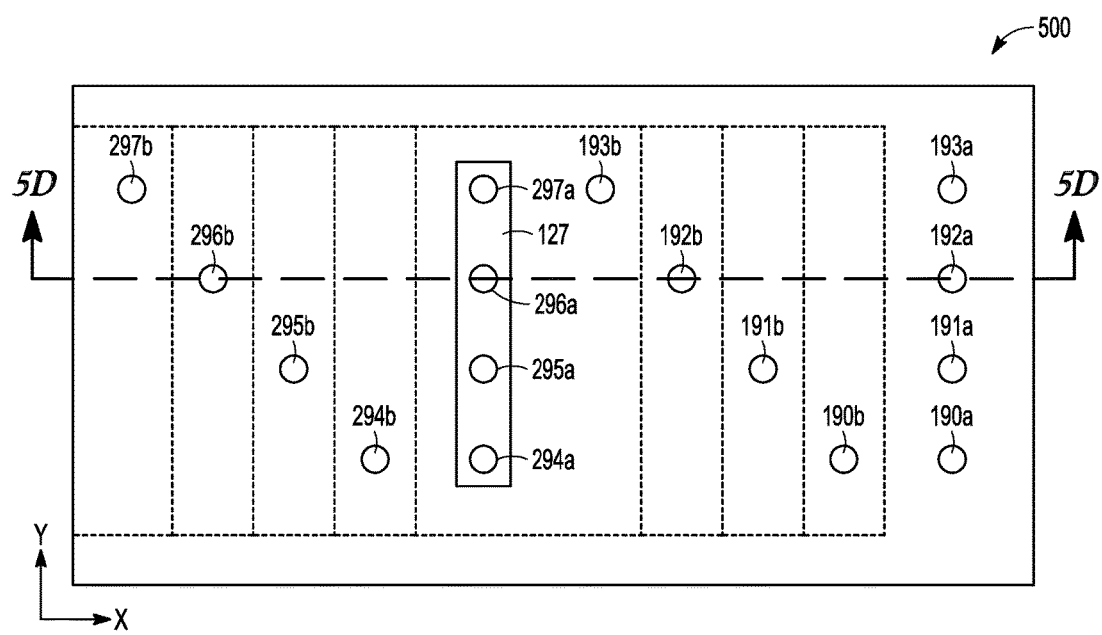

FIG. 5D and FIG. 5E shows memory device 500 after segments 294*a*, 295*a*, 296*a*, and 297*a*, segments 294*b*, 295*b*, 296*b*, and 297*b*, segments 190*a*, 191*a*, 192*a*, 193*a*, and segments 190*b*, 191*b*, 192*b*, and 193*b* have been formed.

FIG. 5E shows a top view of memory device 500 of FIG. 5D. FIG. 5D shows a side view of memory device 500 along line 5D of FIG. 5E. FIG. 5D and FIG. 5E further show memory device 500 after segments (e.g., conductive segments) 294b, 295b, 296b, and 297b have been formed. Forming segments 294a, 295a, 296a, and 297a can include filling openings 175, 176, 177, and 178 (FIG. 5C) with conductive material. Forming segments 294b, 295b, 296b, and 297b can include filling openings 594b, 595b, 596b, and 597b (FIG. 5C) with conductive material. Some of the segments can contact control gates 150, 151, 152, and 153 and control gates 254, 255, 256, and 257 at respective contact areas. For example, as shown in FIG. 5D, segment 192b can contact area 152x of control gate 152. Segment 296b can contact area 256x of control gate 256.

Figure 5F:
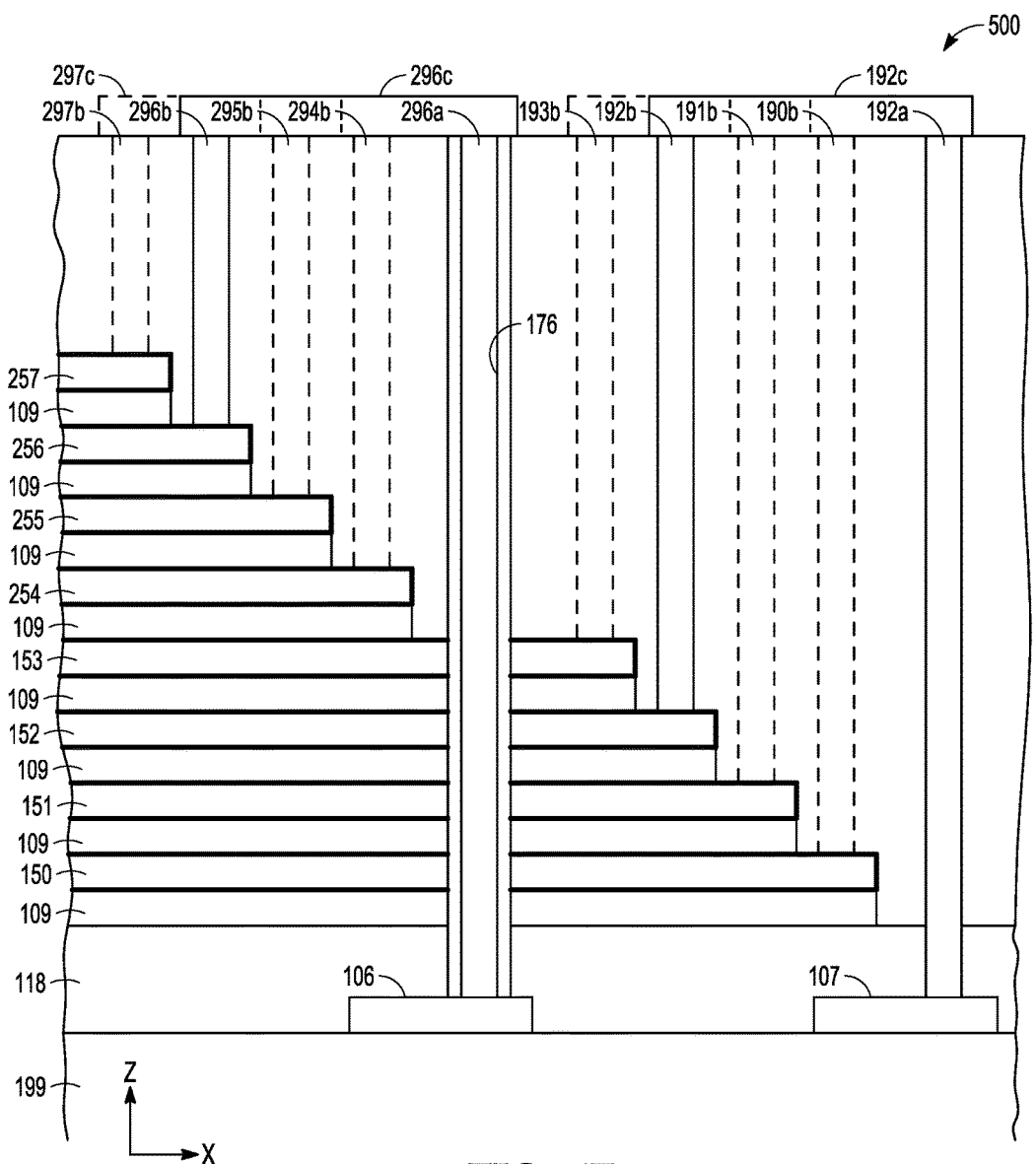
Figure 5G:
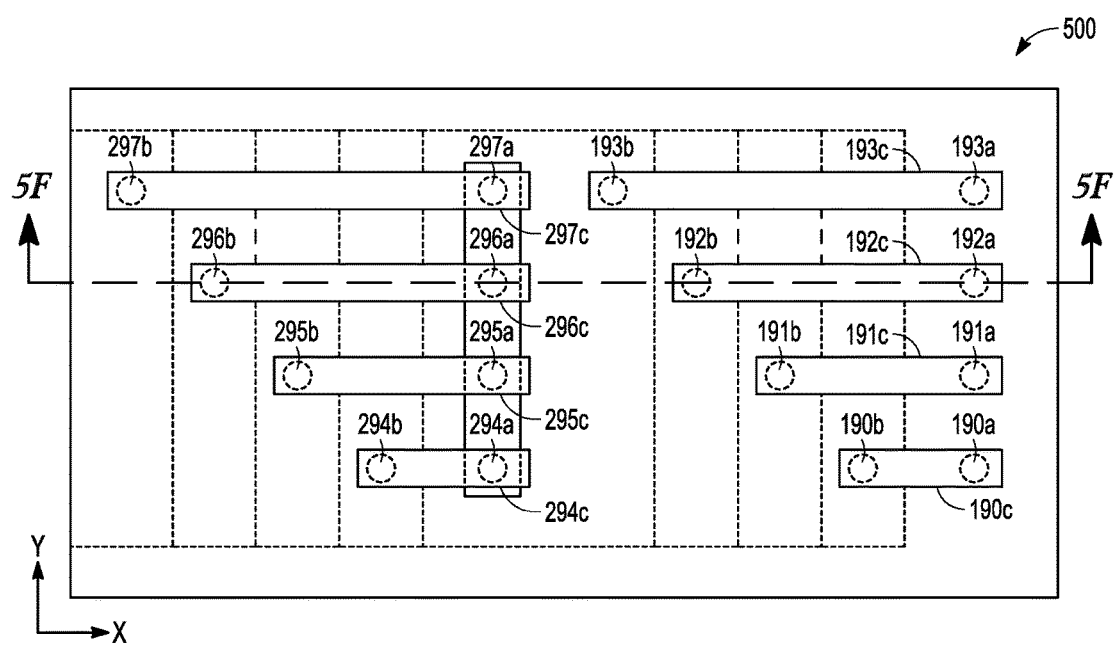

FIG. 5F and FIG. 5G show memory device 500 after 190c, 191c, 192c, and 193c and segments 294c, 295c, 296c, and 297c have been formed. FIG. 5G shows a top view of a portion of memory device 500 of FIG. 5F. FIG. 5F shows a side view of memory device 500 along line 5F of FIG. 5G. As shown in FIG. 5G, segments 190c, 191c, 192c, and 193c can be formed to couple segments 190a, 191a, 192a, and 193a to segments 190b, 191b, 192b, and 193b respectively. Segments 294c, 295c, 296c, and 297c can be formed to couple segments 294a, 295a, 296a, and 297a to segments 294b, 295b, 296b, and 297b, respectively.

Figure 6A:
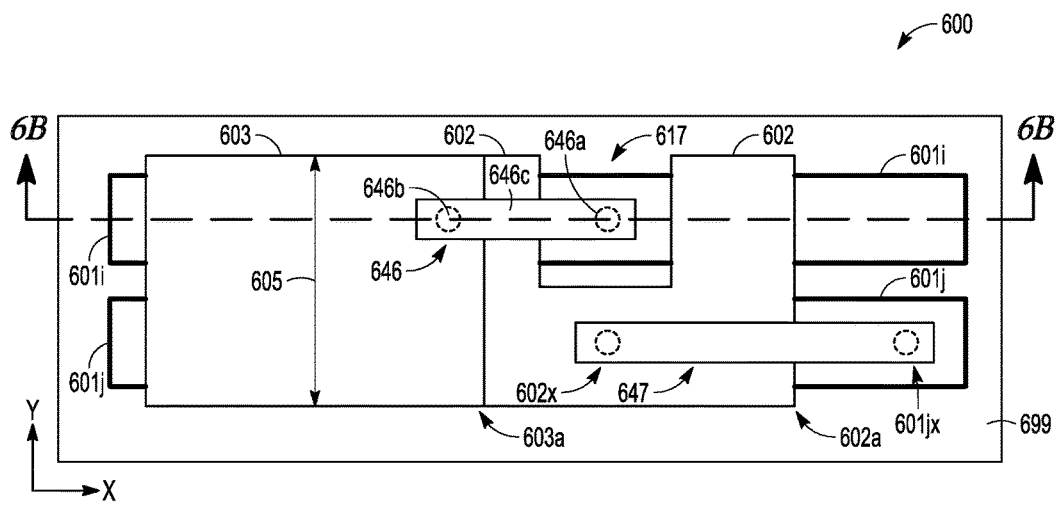
FIG. 6A and FIG. 6B show different views of a structure of a portion of a device having connections coupling among conductive materials of the device, according to an embodiment of the invention.
Figure 6B:
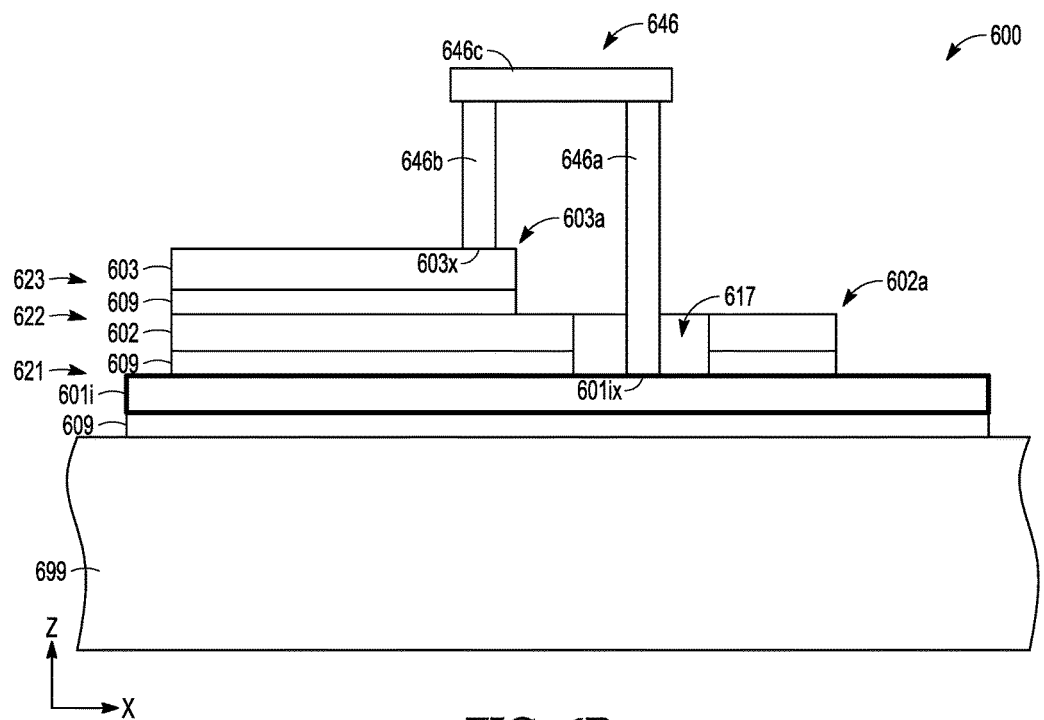

FIG. 6A and FIG. 6B show different views of a structure of a portion of a device 600 having connections 646 and 647 coupling among conductive materials 601i, 601j, 602, and 603, according to an embodiment of the invention. Device 600 can include a semiconductor device (e.g., a memory device, a processor, or other semiconductor devices). Conductive materials 601i, 601j, 602, and 603 can be structured as conductive layers in device 600. Conductive materials 601i, 601j, 602, and 603 can be parts of any elements of device 600 in which such elements can be used to carry signals (e.g., voltage or current signals). For example, if memory device 600 includes a memory device (e.g., memory device 100, 200, 300, 400, and 500), conductive materials 601i, 601j, 602, and 603 can form parts of elements of the memory device, such as select gates, control gates, sources (e.g., source lines), or other elements of the memory device.

As shown in FIG. 6A and FIG. 6B, device 100 can include a substrate 699, which can include a semiconductor substrate (e.g., a silicon substrate). Conductive materials 601i, 601j, 602, and 603 can be located in different device levels 621, 622, and 623 with respect to a z-direction over substrate 699. For example, conductive materials 601i and 601j can be located in device level 621. Conductive material 602 can be located in device level 622. Conductive material 603 can be located in device level 623.

Device 600 can include a dielectric material (e.g., an oxide of silicon or other dielectric material) 609 located between substrate 699 and each of conductive materials 601i and 601j, between conductive material 602 and each of conductive materials 601i and 601j, and between conductive materials 602 and 603.

Each of conductive materials 601i, 601j, 602, and 603 can have a length extending in an x-direction, which is perpendicular to the z-direction. Conductive materials 602 and 603 can have the same width 605 extending in a y-direction, which is perpendicular to the x-direction.

Each of connections 646 and 647 can include different segments (conductive segments) and can be coupled to a contact area of a respective conductive material among conductive materials 601i, 601j, 602, and 603. For example, as shown in FIG. 6B, connection 646 can be coupled to a contact area 603x of conductive material 603 and a contact area 601ix of conductive material 601i. Connection 646 can include segments 646a, 646b, and 646c. Segments 646a and 646b can be perpendicular to substrate 699. Segment 646c can be parallel to substrate 699 and can couple segment 646a to segment 646b. Connection 647 can include segments (e.g., similar to those of connection 646) coupled to a contact area 602x of conductive material 602 and a contact area 601jx of conductive material 601j.

As shown in FIGS. 6A and 6B, conductive material 602 can include an edge 602a along the y-direction. Conductive material 603 can include an edge 603a along the y-direction. Conductive material 602 can include an opening 617 located between edges 602a and 603a. Opening 617 can extend through the entire thickness (in the z-direction) of conductive material 602. Opening 617 can be filled with a dielectric material (not shown in FIG. 6A and FIG. 6B) that can surround a portion of segment 646a of connection 646. Thus, at least a portion (e.g., a portion of segment 646a) of connection 646 can be inside opening 617 going through conductive material 602.

Figure 7A:
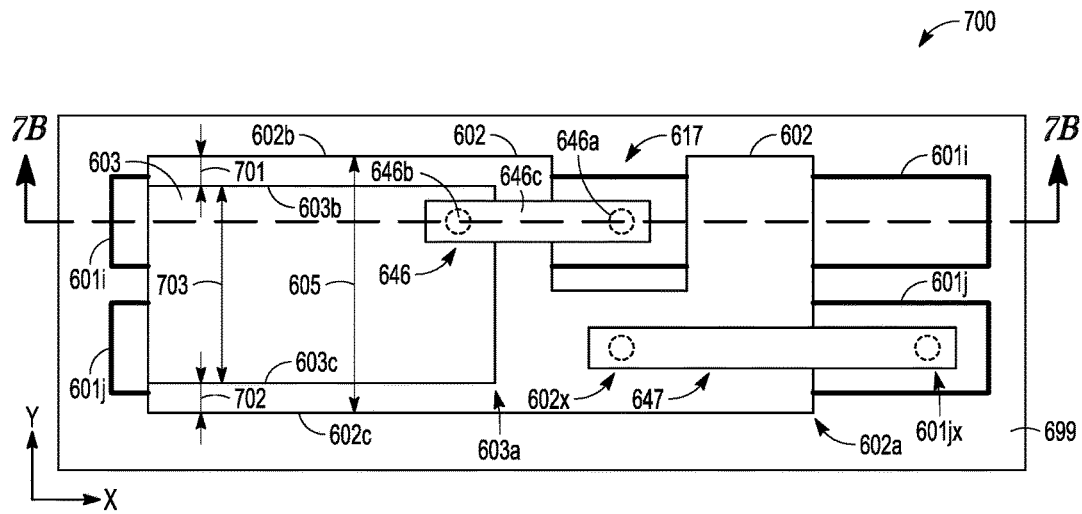
FIG. 7A and FIG. 7B show different views of a structure of a portion of another device, which can be a variation of the device of FIG. 6A and FIG. 6B according to an embodiment of the invention.
Figure 7B:
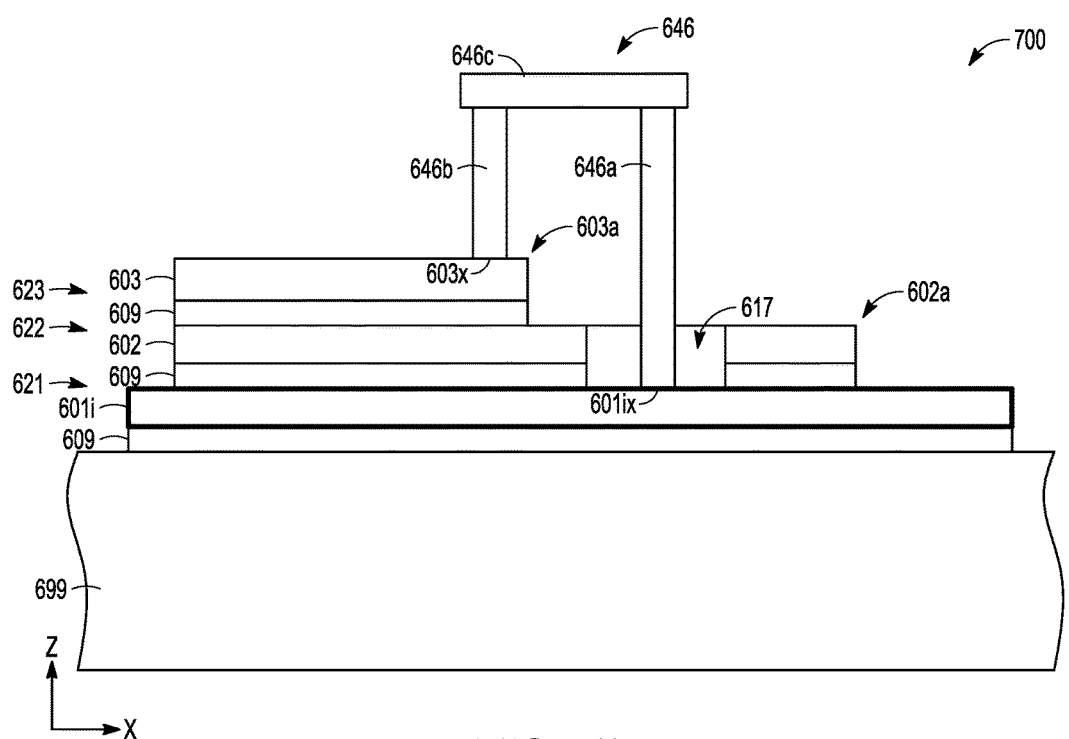

FIG. 7A and FIG. 7B show different views of a structure of a portion of device 700, which can be a variation of device 600 of FIG. 6A and FIG. 6B, according to an embodiment of the invention. As shown in FIG. 7A and FIG. 7B device 700 can include elements similar to or identical to those of device 600 (FIG. 6A and FIG. 6B). Thus, for simplicity, the description of similar or identical elements between devices 600 and 700 is not repeated in the description of FIG. 7A and FIG. 7B.

Example differences between device 600 and 700 can include differences in the structure of conductive material 603 of device 700. As shown in FIG. 7A, conductive material 603 can include a width 703 along the y-direction. Width 703 can be less than width 605 of conductive material 602. For example, width 703 can be less than width 605 by an amount 701 and an amount 702. Amount 701 can be an offset between edges 602b and 603b of respective upper parts of conductive materials 602 and 603. Amount 702 can be an offset between edges 602c and 603c of respective lower parts of conductive materials 602 and 603.

In alternative structure, width 703 can be less than width 605 by either amount 701 or amount 702 but not both. For example, in such an alternative structure, either the upper edges (602b and 603b) of conductive materials 602 and 603 can be aligned with each other (in the z-direction) or the lower edges (602c and 603c) can be aligned of conductive materials 602 and 603 can be aligned with each other (in the z-direction).

The illustrations of apparatuses (e.g., memory devices 100, 100G, 200, 200D, 300, 400, 500, 600, and 700) and methods (e.g., processes of forming memory devices 400 and 500) are intended to provide a general understanding of the structure of various embodiments and are not intended to provide a complete description of all the elements and features of apparatuses that might make use of the structures described herein. An apparatus herein refers to, for example, either a device (e.g., memory devices 100, 100G, 200, 200D, 300, 400, 500, 600, and 700) or a system (e.g., a computer, a cellular phone, or other electronic system) that includes a device such as memory devices 100, 100G, 200, 200D, 300, 400, 500, 600, and 700.

Memory devices 100, 100G, 200, 200D, 300, 400, 500, 600, and 700 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1A through FIG. 7B include apparatuses and methods having a substrate, a memory cell string including a body, a select gate located in a level of the apparatus and along a portion of the body, and control gates located in other levels of the apparatus and along other respective portions of the body. At least one of such apparatuses includes a conductive connection coupling the select gate or one of the control gates to a component (e.g., transistor) in the substrate. The connection can include a portion going through a portion of at least one of the control gates. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a substrate;
    a memory cell string including a body and memory cells located in different levels of the apparatus;
    a first conductive material over the substrate, the first conductive material being part of a select gate associated with the memory cell string and including a portion opposing a first portion of the body;
    a second conductive material over the substrate, the second conductive material being part of a control gate associated with the memory cell string and including a portion opposing a second portion of the body;
    a first connection coupled to a first contact area of the first conductive material and to a first conductive contact located between the first conductive material and the substrate, the first connection including a portion going through a portion of the control gate, wherein no portion of the first connection is going through the select gate; and
    a second connection coupled to a second contact area of the second conductive material and to a second conductive contact located between the second conductive material and the substrate, wherein the second connection includes a segment between the first and second contact areas and extending from one level to another level of the apparatus.

2. The apparatus of claim 1, wherein the second connection includes a first segment perpendicular to the substrate, a second segment perpendicular to the substrate, and a third segment coupling the first segment to the second segment, the third segment being parallel to the substrate and extending between the first and second contact areas.

3. The apparatus of claim 2, wherein the second segment of the second connection includes the segment between the first and second contact areas.

4. The apparatus of claim 1, wherein the apparatus comprises a memory device, the memory device comprising the memory cell string.

5. An apparatus comprising:
    a substrate;
    a memory cell string including a body;
    a select gate located in a first level of the apparatus and along a first portion of the body;
    a control gate located in a second level of the apparatus and along a second portion of the body;
    a first connection coupled to the select gate and to a first transistor having at least a portion formed in the substrate, the first connection including a portion going through a portion of the control gate, wherein no portion of the first connection is going through the select gate; and
    a second connection coupled to the control gate and to a second transistor having at least a portion formed in the substrate, wherein the first and second connections are on a same side of the body of the memory cell string.

6. The apparatus of claim 5, further comprising an opening through the control gate, wherein the portion of the first connection going through the portion of the control gate is inside the opening.

7. The apparatus of claim 6, further comprising:
    an additional memory cell string including an additional body extending outwardly from the substrate;
    an additional select gate located in the first level of the apparatus and along a portion of the additional body; and
    an additional connection coupled to the additional select gate and to an additional transistor having at least a portion formed in the substrate, the additional connection including a portion going through an additional opening in the control gate.

8. The apparatus of claim 5, further comprising an additional control gate located in a third level of the apparatus and along a third portion of the body, wherein the first connection includes an additional portion going through a portion of the additional control gate.

9. The apparatus of claim 8, further comprising an opening through the control gate and the additional control gate, wherein the portion of the first connection going through the portion of the control gate is inside the opening, and the additional portion of the first connection going through the portion of the additional control gate is also inside the opening.

10. The apparatus of claim 9, wherein the select gate includes an edge, the control gate includes an edge, and the opening is between the edge of the select gate and the edge of the control gate.

11. The apparatus of claim 10, wherein the distance between the body and the edge of the control gate is greater than a distance between the body and the edge of the select gate.

* * * * *